United States Patent [19]

Harris et al.

[11] Patent Number: 5,475,323

[45] Date of Patent: Dec. 12, 1995

[54] AMPLIFIER WITH INPUT COMMON MODE COMPENSATION

[75] Inventors: Larry L. Harris; Baker P. L. Scott, III, both of Austin, Tex.

[73] Assignee: Crystal Semiconductor Corporation, Austin, Tex.

[21] Appl. No.: 186,787

[22] Filed: Jan. 25, 1994

Related U.S. Application Data

[63] Continuation of Ser. No. 60,431, May 7, 1993, Pat. No. 5,339,067.

[51] Int. Cl.⁶ .................................................. H03K 5/22
[52] U.S. Cl. ............................... 327/67; 327/65; 327/563
[58] Field of Search ...................... 307/494, 491; 330/258, 253; 327/65, 66, 67, 363, 359, 87, 563

[56] References Cited

U.S. PATENT DOCUMENTS

| | | | |
|---|---|---|---|
| 3,666,995 | 5/1972 | Wensink et al. | 317/101 A |
| 3,868,846 | 3/1975 | Kushida et al. | 324/98 |
| 4,028,642 | 6/1977 | Kushida et al. | 323/366 |
| 4,028,718 | 6/1977 | Migitaka et al. | 357/27 |
| 4,147,943 | 4/1979 | Peterson | 307/355 |
| 4,181,878 | 1/1980 | Murari et al. | 323/94 R |
| 4,245,209 | 1/1981 | Bertotti et al. | 338/217 |
| 4,468,628 | 8/1984 | Gross | 330/258 |
| 4,496,911 | 1/1985 | Lenz | 330/297 |
| 4,573,020 | 2/1986 | Whatley | 330/258 |
| 4,658,159 | 4/1987 | Miyamoto | 307/530 |
| 4,868,417 | 9/1989 | Jandu | 307/355 |
| 4,887,048 | 12/1989 | Krenik et al. | 330/258 |
| 4,901,031 | 2/1990 | Kalthoff et al. | 330/253 |
| 4,916,338 | 4/1990 | Metz | 307/495 |
| 4,933,644 | 6/1990 | Fattaruso et al. | 330/358 |
| 4,962,323 | 10/1990 | Ta | 307/350 |
| 5,187,448 | 2/1993 | Brooks et al. | 330/258 |
| 5,239,210 | 8/1993 | Scott | 307/355 |

OTHER PUBLICATIONS

Plaza, "Power–Supply Rejection in Differential Switch Capacitor Filters", (FIG. 3), IEEE 1984, pp. 912–918.
Dallas Semiconductor Part Data Sheets, DS1666, DS1666s Audio Digital Resistor, pp. 1–5, 1992, printed in USA.
Dallas Semiconductor Part Data Sheets, DS1267 Dual Digital Potentiometer Chip, pp. 750–757, 1990, printed in USA.
Toshiba Parts Data Sheets, TC9176P and TC9177P Audio (List continued on next page.)

*Primary Examiner*—Toan Tran
*Attorney, Agent, or Firm*—Arnold, White & Durkee

[57] ABSTRACT

An integrated circuit apparatus and method is provided for utilizing voltage dividers and differential amplifiers. An apparatus and method for dividing a voltage with a resistor voltage divider and for employing the voltage divider in an integrated circuit. The resistor voltage divider utilizes inaccessible compensation taps that are placed between nonlinearly spaced output taps. The compensation taps reduce the impact of tap resistance on the voltage divider transfer function. The number of inaccessible compensation taps placed between output taps is dependant upon a chosen tap density that is substantially maintained across the body of the resistor voltage divider. The resistor may be used in integrated circuits employing amplifiers, such as volume control circuitry. A differential amplifier is provided with an input common mode feedback loop that compensates for signal distortion due to a common mode signal. The effects that mode changes in the input transistors have on the differential gain are minimized by the input common mode feedback loop. The differential signal path has only one low frequency mode. The amplifier includes circuitry that acts on the input differential signal and circuitry that acts on the varying input common mode voltage. The common mode feedback is achieved using a variable current sink transistor. The gate voltage of the variable current sink transistor is controlled by the sum of currents flowing through transistors that are connected to the drains of the differential input transistors.

15 Claims, 17 Drawing Sheets

OTHER PUBLICATIONS

Digital IC, p. 437 and 13 pages, date and place of printing unknown.

Crystal Semiconductor Corporation, Stereo Digital Volume Control Preliminary Product Information, pp. 1–11, Nov., 1992, printed in USA.

Ting, Chung–Yu, and Chen, Charles Y., "A Study of the Contacts of a Diffused Resistor," *Solid State Electronics*, 14:433–438, published in Europe.

Dialog Search Report dated Feb. 28, 1993, printed in USA.

SGS–Thomson Microelectronics, TDA7318, Digital Controlled Stereo Audio Processor, Advance Data, pp. 727–737, May 1991, printed in USA.

Williamsen, Mark, "Digitally Controlled am;plfier Takes 1–dB Steps," *Electronic Design News* (*EDN*), pp. 210 and 212, May 7, 1992, published in USA.

*Analysis and Design of Analog Integrated Circuits,* 2nd Ed., pp. 752–755, Paul Gray and Robert Meyer (1984) printed in USA.

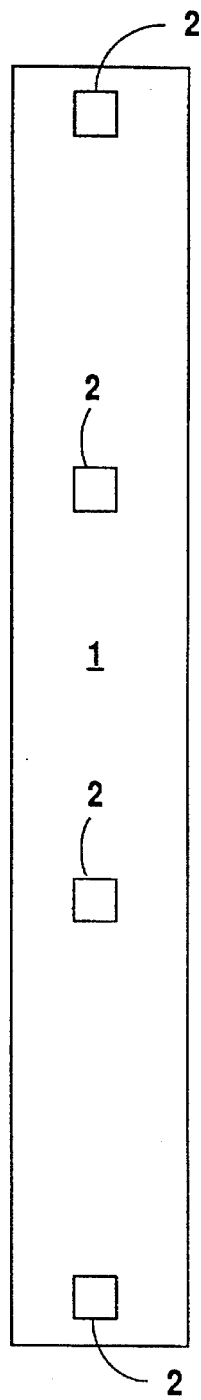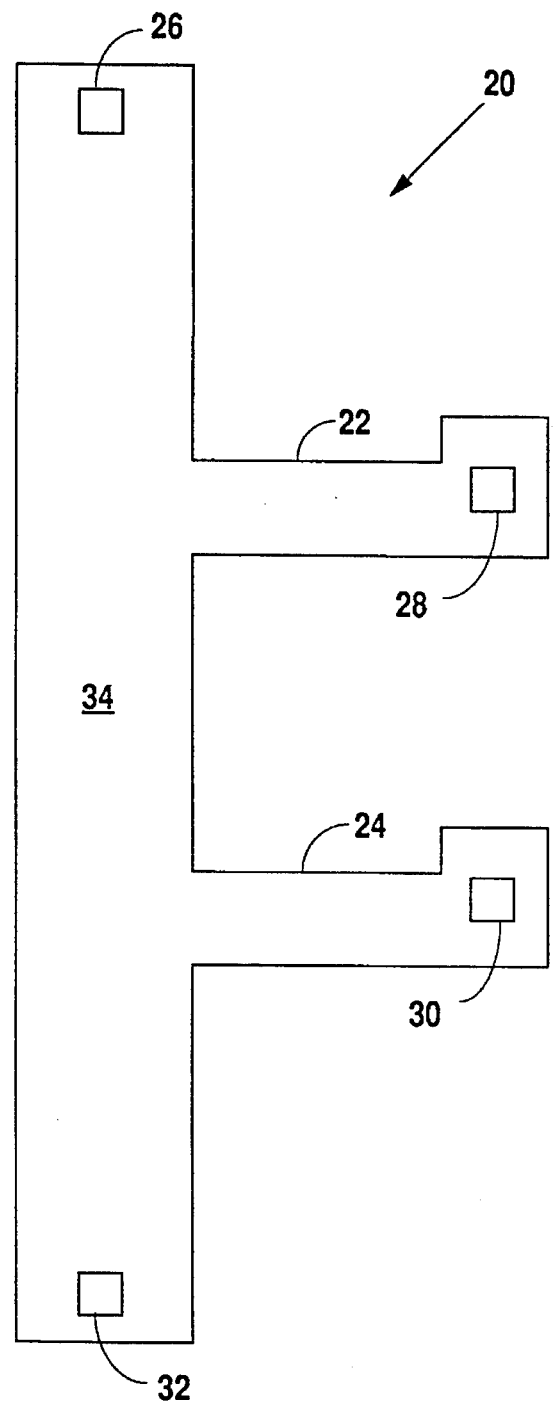
Fig. 1
(PRIOR ART)
Fig. 2
(PRIOR ART)

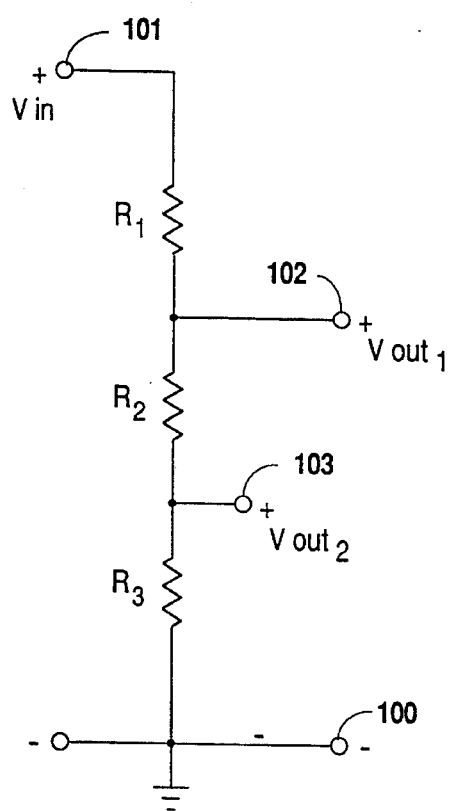
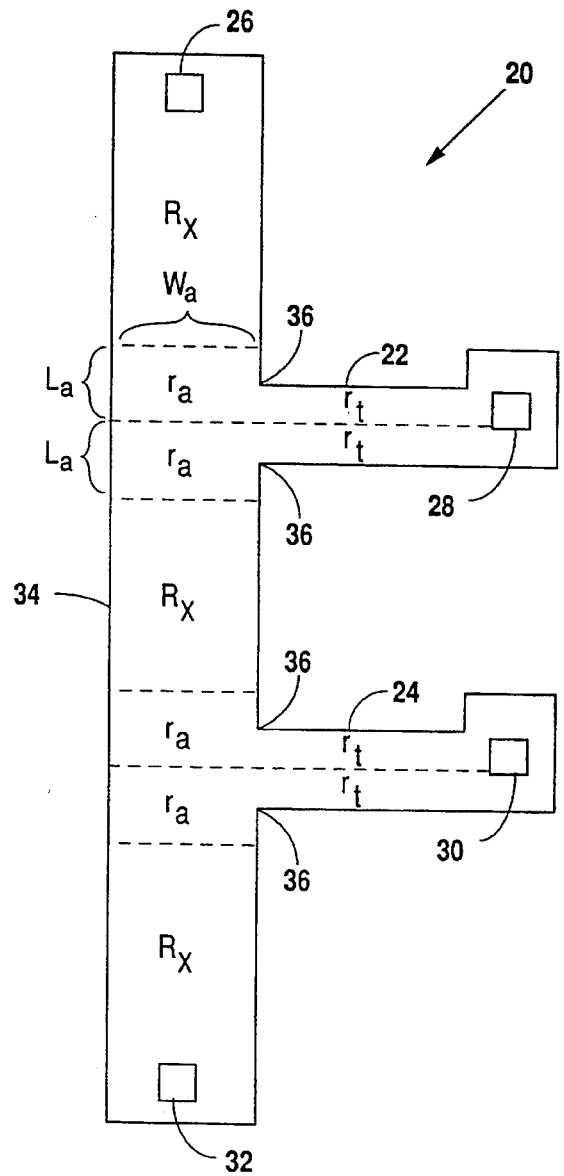
Fig. 3
(PRIOR ART)
Fig. 4
(PRIOR ART)

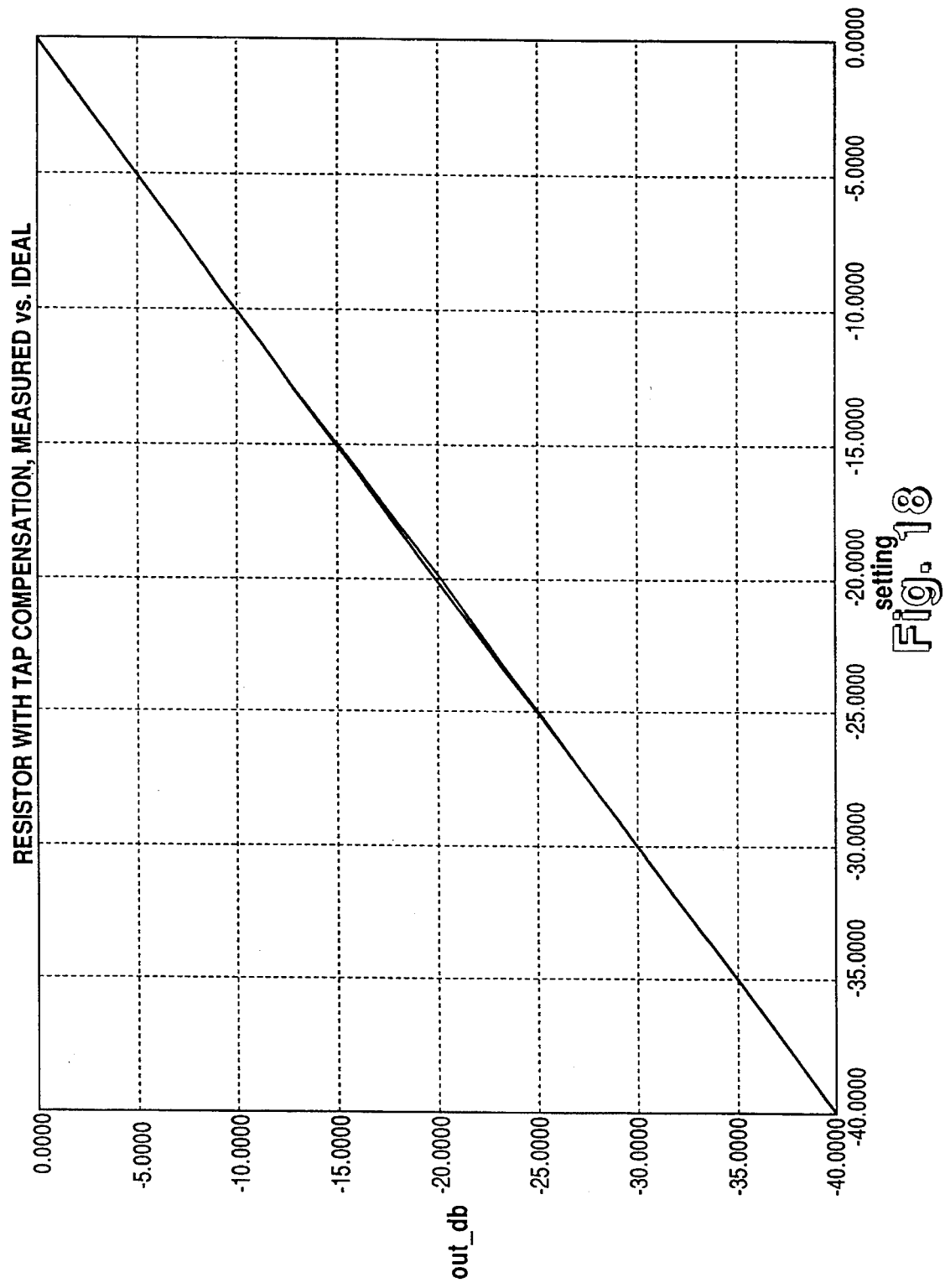

AMPLIFIER WITH INPUT COMMON MODE COMPENSATION

This is a continuing application of patent application Ser. No. 08/060,431 filed on May 7, 1993, now U.S. Pat. No. 5,339,067 issued Aug. 16, 1994

BACKGROUND OF THE INVENTION

The present invention relates to integrated circuits having voltage dividers or amplifiers. More particularly a device is provided for dividing a voltage across integrated circuit resistors and a differential amplifier is provided having high accuracy, including high signal to distortion performance and high tolerance to large input common mode signals.

Integrated circuits often utilize resistive voltage dividers and differential amplifiers, Electronic resistors are fabricated by using several different techniques. Fabrication methods include depositing a thin or thick resistive films on a substrate or forming a resistive path directly within a substrate, typically silicon, by using a dopant species, Such resistors are often used in microelectronics applications such as integrated circuits and hybrid microcircuits. Such resistors may be used in a resistor divider network that is a discrete circuit or may be used as part of a complicated integrated circuit, Resistive films often include polysilicon or nickel-chrome and dopant species often include boron, phosphorus or arsenic. Regardless of the type of resistor material or fabrication process, the resistance of such a microelectronic resistor can be generally described by Equation 1:

$$R = \Omega/\square \times \frac{L}{W} \quad (1)$$

where R is the resistor value in Ohms, $\Omega/\square$ is the sheet resistance in Ohms per square, L is the length of the resistor, and W is the width of the resistor. As known in the art, a square is dimensionless and is simply a portion of the resistor consisting of one unit length and one unit width.

Resistors may be used to create voltage dividers by providing a voltage across or current through the resistor and providing an output connection along some portion of the resistor. An individual voltage output of a microelectronic resistor voltage divider generally has a linear relationship with the voltage input of the resistor voltage divider. Furthermore, a voltage divider may have multiple outputs and each separate voltage output may have a linear relationship with the voltage input. On a voltage divider with multiple outputs, it is instructive to number each output consecutively starting from the top of the resistor divider progressing to the bottom of the resistor divider. When a plot is generated relating the input voltage attenuation of each output voltage to the respective output number, with one axis of the plot being the attenuation value and the other axis being the output number, this plot will be linear or nonlinear plot which is dependent upon the spacing of the outputs of the voltage divider.

Linear voltage dividers are defined as having a substantially linear plot of the voltage attenuation of each output and the related output numbers. Nonlinear voltage dividers are defined as having a substantially nonlinear plot of the voltage attenuation of each output and the related output numbers. The relationship between the outputs of the nonlinear voltage divider may be, for example, a logarithmic function, a square law function, or an exponential function. The individual transfer function between a voltage input and a specific output in a nonlinear voltage divider, though, may still be generally linear.

Voltage or current input and voltage output contact sites or taps may be made to a resistor in a variety of ways. FIG. 1 shows integrated circuit or hybrid microcircuit resistor 1 with taps 2 connecting from the top of the main body of resistor 1. In FIG. 1, taps 2 may simply consist of interconnect contacts, such as aluminum contacts. Alternatively, taps 2 may be upward extensions of the resistive film that are then connected to an interconnect lead. Other tap arrangements exist. For example, FIG. 2 shows resistor 20 having a main body 34 and output taps 22 and 24 which extend from main body 34 in order to provide a location for output contact sites 28 and 30. Input contact sites 26 and 32 are also provided. Many other geometric arrangements may be selected for taps. Furthermore, the tap spacing may be either linear or nonlinear along the resistor body. If all taps are spaced at substantially equal distance intervals along the resistor body, then linear spaced taps are created. Therefore, with linear spacing all resistor segments, whether between an input and an adjacent output or between adjacent outputs, are of equal length. If the taps are spaced such that all resistor segments are not of equal length than nonlinear tap spacing has been created.

Generally, contact sites, taps, and their placement will have some impact on each specific electrical transfer function of the voltage divider and, thus, will vary the actual transfer function from the transfer function of an ideal voltage divider. It is desirable to lessen the impact that output connections have on a transfer function of a resistor voltage divider. Furthermore, the impact of output connections is generally more severe in nonlinear voltage dividers than in linear voltage dividers. Therefore, it is desirable to lessen the impact of taps in nonlinear voltage dividers such as, for example, voltage dividers that allow logarithmic attenuation.

Microelectronic linear voltage dividers are generally made by providing linearly spaced output taps along the resistor body, while microelectronic nonlinear voltage dividers are generally made by providing nonlinear spacing of the output taps of a voltage divider. Alternatively, it is known in the art to provide a series of linearly spaced taps where all taps are accessible to the user, and allow a user to select the specific desired output taps. Thus, a user may use a voltage divider that has linearly spaced taps as a nonlinear voltage divider by only selecting outputs that have substantially nonlinearly related transfer functions. Furthermore, by providing only linear spaced outputs, a desired output voltage that requires nonlinear spacing of taps can only be approximated. Though such systems may lessen the impact of tap resistance, excess circuitry space may be consumed because these systems may allow the user to access every tap, and thus, every tap has some corresponding access and decoding interconnects and circuitry. It is, therefore, desirable to lessen the impact resulting from tap connections while limiting the amount of circuit space and complexity, and provide a very accurate representation of the desired nonlinearly related transfer functions.

Differential amplifiers made be designed in a variety of ways. FIG. 22 shows a schematic of a prior art "folded-cascode" amplifier. An example of a folded cascode amplifier is shown and described in *Analysis and Design of Analog Integrated Circuits*, 2nd Ed., pages 752–755, Paul Gray and Robert Meyer (1984). Two differential input transistors 1000A and 1010A are provided having their sources connected together and tied to the drain of transistor 2010A. The gate of transistor 2010A is biased such that it supplies the tail current source of the input differential pair, transistors 1000A and 1010A. Transistors 3000A and 3010A supply a current to the drain connection of the input pair transistors 1000A and 1010A and also to the source connection of transistors 3020A and 3030A. The value of the current flowing into the source connection of transistor 3020A is approximately equal to the value of the current flowing in transistor 3000A minus one half the current flowing in transistor 2010A. Likewise, the value of the current flowing into the source connection of transistor 3030A is equal to the value of the current flowing in transistor 3010A minus one half the current flowing in transistor 2010A. Transistors 3040A and 3050A form a current mirror such that the current flowing in transistor 3020A is mirrored to the output of the amplifier. Thus, the output current of the amplifier is the current flowing in transistor 3030A minus the current flowing in transistor 3020A.

Transistors 4000A through 4070A are cascode transistors for the transistors that are connected to their respective sources. Though transistors 4000A through 4070A are not required for the amplifier to work, adding these transistors improves the intrinsic offset of the amplifier and increases the dc gain of the amplifier. Another advantage obtained by adding transistors 4000A and 4010A is that the gate bias voltage of transistors 4000A and 4010A can be slaved to the input common mode voltage such that the drain to source voltage of transistors 1000A and 1010A does not change with an input common mode signal. Such gate biasing of transistors 4000A and 4010A helps input common mode rejection but does not cancel all sources of error due to a varying input common mode voltage.

A "folded-cascode" amplifier has several sources of error due to a varying input common mode voltage. All these sources of error have an equivalent effect of causing the current in transistor 10 to be different than the current in transistor 11.

U.S. Pat. No. 5,239,210 to Scott, which is expressly incorporated herein by reference, describes an amplifier that attempts to keep the current in the input transistor pair and the drain to source voltage of the input pair constant by using a localized feedback loop around each transistor of the input pair. Scott's circuit topology is an attempt to provide an amplifier with good input common mode voltage over a higher frequency range than an amplifier that does not have such localized feedback loops. Scott's circuit topology has two low frequency nodes in the differential signal path and an input common mode voltage range of Vss+2Vdsat+Vt to Vcc−(Vdsat+Vt).

FIG. 23 is a schematic of a prior art amplifier with a feedback loop to cancel input common mode error signals as described by Scott. This amplifier has a different topology than a "folded-cascode" amplifier.

In FIG. 23, transistors 1000B and 1010B form the input differential pair. Transistor 2010B forms the tail current source for the input differential pair. Transistors 3000B and 3010B form a current source load for the input differential pair, transistors 1000B and 1010B. Transistors 4000B and 4010B are cascode transistors for the input differential pair, transistors 1000B and 1010B. Transistors 6000B and 6010B are the output transistors of the input stage. Transistor 3040B and 3050B form a current mirror such that the current flowing in transistor 6000B is mirrored to the output of the amplifier. Thus, the output current of the amplifier is the current flowing in transistor 6010B minus the current flowing in transistor 6000B. Transistors 7000B, 7010B, and 7020B form the input common mode feedback loop.

Transistors 7000B and 7010B act in a negative feedback fashion to keep the current in transistors 1000B and 1010B equal to the current flowing in transistors 3000B and 3010B. Transistor 7020B acts as the gate bias voltage generator for transistors 4000B and 4010B. This gate bias voltage generator is slaved to the input common mode voltage and performs the function of keeping a constant drain to source voltage on the input differential pair, transistors 1000B and 1010B.

The frequency response of any amplifier is generally dominated by what is known as the low frequency poles of the circuit. In the differential signal path of the amplifier shown in FIG. 23, the dominant low frequency poles are located at the output node "OUTPUT" and nodes "A" and "B". Nodes "A" and "B" also form the dominant low frequency poles of the common mode feedback path.

A "folded-cascode" amplifier does not have good high frequency input common mode voltage rejection as the amplifier disclosed in Scott. But, a "folded-cascode" amplifier has a wider input common mode voltage range of Vss+2Vdsat+Vt to Vdd−Vdsat, and has only one low frequency node in the differential signal path.

SUMMARY OF THE INVENTION

The problems outlined above are in a broad aspect addressed by the devices and methods of the present invention.

The apparatus and method of the present invention lessens the impact of taps in voltage dividers that have nonlinearly related transfer functions while maintaining a very accurate representation of the desired nonlinearly related transfer functions.

The present invention includes a resistor voltage divider that has a plurality of accessible output taps distributed along a resistor body. In addition, at least one inaccessible compensation tap is also placed along the resistor body. The accessible output taps may be nonlinearly distributed. In a preferred embodiment, the accessible output taps are logarithmically distributed. Furthermore, the taps are distributed such that a chosen tap density is substantially constant over a portion of the resistor body. Generally, the tap density between one accessible output tap and an input tap to the resistor voltage divider is substantially equal to the tap density between a second accessible output tap and the input tap. Moreover, the tap density between each output tap and an input tap may be substantially constant. Finally, the taps may be spaced such that the taps are substantially linearly distributed along the resistor bodies.

The present invention also includes a voltage divider circuit utilizing an integrated circuit resistor body having a plurality of taps and electrical leads connected to at least two of those taps. Further, the circuit has tap selection circuitry connected to the electrical leads such that the tap selection circuitry may electrically select some, but not all of the taps, whereby at least one of the taps is not selectable and at least two of the taps are selectable. In addition, the taps may comprise accessible output taps and at least one inaccessible compensation tap which may be placed along the resistor body to substantially minimize a tap resistance error in the transfer function of the circuit. Finally, at least one of the inaccessible compensation taps of the circuit may be structurally disconnected from the input of the tap selection circuitry.

The voltage divider may be made by placing a plurality of accessible output taps along the resistor body in a desired nonlinear spacing pattern. Thus, resistor segments with nonlinear lengths between adjacent accessible output taps are created. Then, inaccessible compensation taps are placed along the resistor body in order to substantially minimize tap resistance effects. The tap resistance effects may be minimized by selecting a predetermined tap density and placing inaccessible compensation taps to substantially maximize the equality of the tap density in each nonlinear length resistor segment. Furthermore, the placement of the inaccessible tap may create substantially linear tap spacing along the resistor body when all of the taps are considered.

The resistor voltage divider in the present invention is particularly useful when used in an integrated circuit amplifier circuit. A resistor voltage divider is operatively connected to an amplifier. The resistor voltage divider has a plurality of successful output taps, at least one inaccessible compensation tap and an input tap distributed along the resistor body. The taps are distributed such that a tap density between one accessible output tap and the input tap, and the tap density between a second accessible output tap and the input taps are substantially equal. The voltage divider may be connected to a voltage source and one of the accessible output taps connected to a signal input of the amplifier. Further, the voltage divider may be connected to the signal output of the amplifier and one of the accessible output taps then connected to the feedback input of the amplifier. Alternatively, one voltage divider may be operatively connected to the signal input of the amplifier and a second voltage divider operatively connected to the feedback input of the amplifier.

Finally, it is noted that with the present invention, a nonlinear volume control circuit may utilize circuitry that includes an amplifier and two resistor voltage dividers each having a plurality of accessible output taps, at least one inaccessible compensation tap, and an input tap. The taps are distributed whereby the tap density between an output tap and an input tap is substantially equal to the tap density between a second output tap and the input tap. Furthermore, multiplexer circuits are provided for decoding one of the accessible output taps and connecting the output tap to a signal input or a feedback input of an amplifier. The amplifier utilized may be a differential amplifier as discussed below.

In another embodiment of the invention, to be described hereinbelow, a differential amplifier is provided with an input common mode feedback loop that compensates signal distortion problems due to a common mode signal. This input common mode feedback loop causes the output signal of the differential amplifier to generally be the differential input signal multiplied by the signal gain of the differential amplifier. The effects that common mode changes in the input transistors have on the differential gain are minimized by the input common mode feedback loop. The common mode feedback loop has a single low frequency node that lies outside the differential signal path. Thus, the input common mode feedback loop may have very high open-loop gain which improves input common mode rejection without causing a stability problem with the differential signal path. The input common mode voltage range of this new amplifier is similar to that of a "folded-cascode" amplifier. The differential signal path has only one low frequency node, which is the output node of the amplifier, and this low frequency node does not lie in the common mode feedback signal path.

In one embodiment of the invention, a differential amplifier includes first and second differential transistors, each having source/drain paths connected on a first end to a first common node. First and second current sources supply current to second ends of the respective differential transistors. Furthermore, a common constant current source sinks current from the common node of the differential transistors to a reference voltage node. Another current source, a variable current source, also sinks current from the common node to the reference node. In addition, the differential amplifier includes control circuitry which interfaces with the first and second differential transistors for sensing the current through the transistors and controlling the common variable current source to maintain the current through the first and second differential transistors substantially constant.

In yet another embodiment of the invention, a differential amplifier includes differential signal circuitry which has an output that reflects the differential voltage on the respective gate terminals of two differential transistors. Furthermore, third and fourth transistors are disposed in series between a first voltage supply and the first differential transistor and the first voltage supply and the second differential transistor respectively. This amplifier includes common feedback circuitry which connects to one end of the source/drain path of the third transistor and to one end of the source/drain path of the fourth transistor. This common mode feedback circuitry controls a variable current source to maintain the current through the first and second differential transistors substantially constant. The common mode feedback circuitry has one low frequency pole at a first node which is present outside the differential signal circuitry and there is at least one low frequency node in the differential signal circuitry at the output of the amplifier.

The present invention also relates to a method for compensating for a common mode signal in a differential amplifier. This method includes providing differential transistors which have a source/drain connected to a common node. The method also includes generating first and second constant current sources for input to respective differential transistors. Furthermore, the method includes generating a common current source and a variable current source between the common node and a reference voltage node. The variable current source current is varied to maintain the current through the first and second differential transistors independent of current variation through the common current source.

BRIEF DESCRIPTION OF THE DRAWINGS

FIG. 1 is a plan view of a microelectronic resistor with contact sites within the main body of the resistor.

FIG. 2 is a plan view of a microelectronic resistor voltage divider with taps.

FIG. 3 is a schematic of an ideal resistor voltage divider.

FIG. 4 is a plan view of a resistor voltage divider incorporating tap resistance effects.

FIG. 18 shows a graph of the measured attenuation verses ideal attenuation of an integrated circuit resistor voltage divider with inaccessible compensation taps.

DETAILED DESCRIPTION

Figure 5:
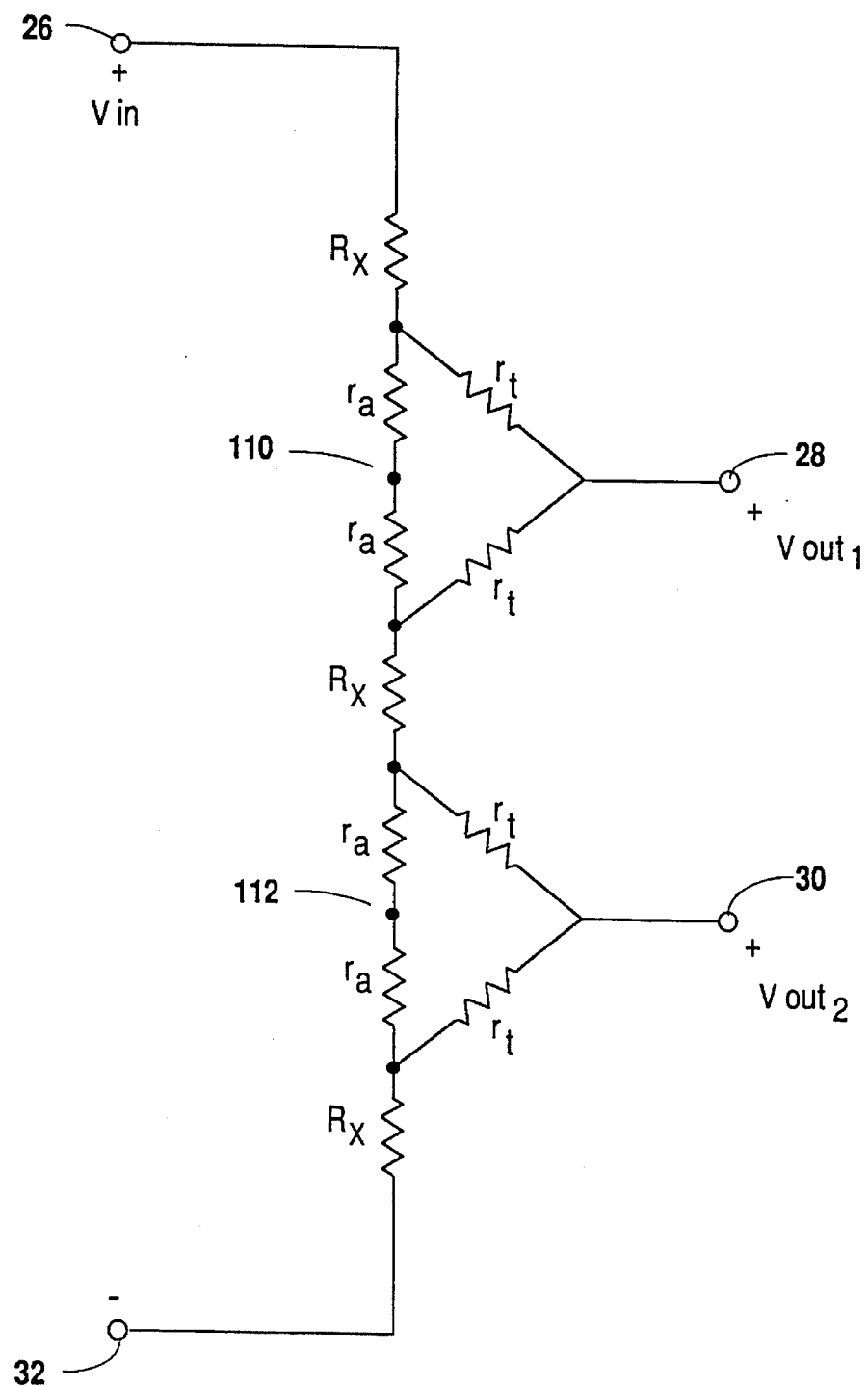
FIG. 5 is a schematic of the integrated circuit resistor voltage divider shown in FIG. 4.

The schematic of an ideal resistor voltage divider is shown in FIG. 3. Three integrated circuit resistors are shown as $R_1$, $R_2$, and $R_3$. However, it is understood that the number of resistors may be $R_n$ where n=1,2,3 . . . The resistors have a length $L_1$, $L_2$, and $L_3$, and width $W_1$, $W_2$, and $W_3$ respectively. The voltage drop between node 101 and node 100 is Vin, the voltage drop between node 102 and node 100 is $Vout_1$, and the voltage drop between node 103 and node 100 is $Vout_2$. The relationship between the input and output voltages (i.e., the voltage transfer function) of the voltage divider of FIG. 1 is shown in Equation 1a:

$$\frac{Vout_1}{Vin} = \frac{R_2 + R_3}{R_1 + R_2 + R_3} = \frac{R_2 + R_3}{R_{TOTAL}} \quad (1a)$$

where $R_{TOTAL} = R_1 + R_2 + R_3$

If all the resistors are made of the same material and thus have the same sheet resistance, substituting Equation 1 into Equation 1a yields Equation 1b:

$$\frac{Vout_1}{Vin} = \quad (1b)$$

-continued $$\frac{\Omega/\square \left( \frac{L_2}{W_2} + \frac{L_3}{W_3} \right)}{\Omega/\square \left( \frac{L_1}{W_1} + \frac{L_2}{W_1} + \frac{L_3}{W_3} \right)} = \frac{\frac{L_2}{W_2} + \frac{L_3}{W_3}}{\frac{L_1}{W_1} + \frac{L_2}{W_2} + \frac{L_3}{W_3}}$$

If the width of each resistor is the same, Equation 1b reduces to Equation 2:

$$\frac{Vout_1}{Vin} = \frac{L_2 + L_3}{L_1 + L_2 + L_3} \quad (2)$$

If the length of each resistor is the same, then the voltage relationship shown in Equation 2 further simplifies to the relationship shown in Equation 3:

$$\frac{Vout_1}{Vin} = \frac{2L}{3L} = \frac{2}{3} \quad (3)$$

Similarly, with the same assumptions as for Equation 3, Equation 4 may be obtained:

$$\frac{Vout_2}{Vin} = \frac{L_3}{L_1 + L_2 + L_3} = \frac{1}{3} \quad (4)$$

Thus for ideal voltage dividers with resistors of equal length, equal width and equal sheet resistance, Equations 2, 3, and 4 show that the voltage transfer functions are simply the ratio of the resistor lengths.

A microelectronic resistor voltage divider 20 with linearly spaced output taps is shown in FIG. 2. In order to contact voltage divider 20, accessible outputs or tap connections are generally provided. FIG. 2 shows integrated circuit resistor voltage divider 20 and taps 22 and 24. Taps 22 and 24 are equally spaced along main body 34 of voltage divider 20 in order to create resistors of equal length. Connection sites 26, 28, 30 and 32 are also shown in FIG. 2. Adding taps to voltage divider 20 will result in the creation of parasitic tap resistances between tap connection sites 28 and 30 and main body 34 of voltage divider 20. The effect of a tap is to place parasitic resistors, $r_t$, associated with the tap in parallel with small resistor segments, $r_a$, of the body of the resistor that is effected by $r_t$ as shown in FIG. 4. Each resistor segment $r_a$, has a length $L_a$ and width, $W_a$, as shown in FIG. 4. Similarly, resistor segments $r_t$ have effective lengths $L_t$ and effective widths $W_t$. Resistor segments $r_a$ will slightly extend past corners 36 where taps 22 and 24 connect to main body 34 because of current dispersions effects around corners 36. Assuming that main body 34 of voltage divider 20 has a constant width and uniform sheet resistance, then the remainder of main body 34 of voltage divider 20 may be represented by equal resistance resistor segments $R_x$.

Figure 6:
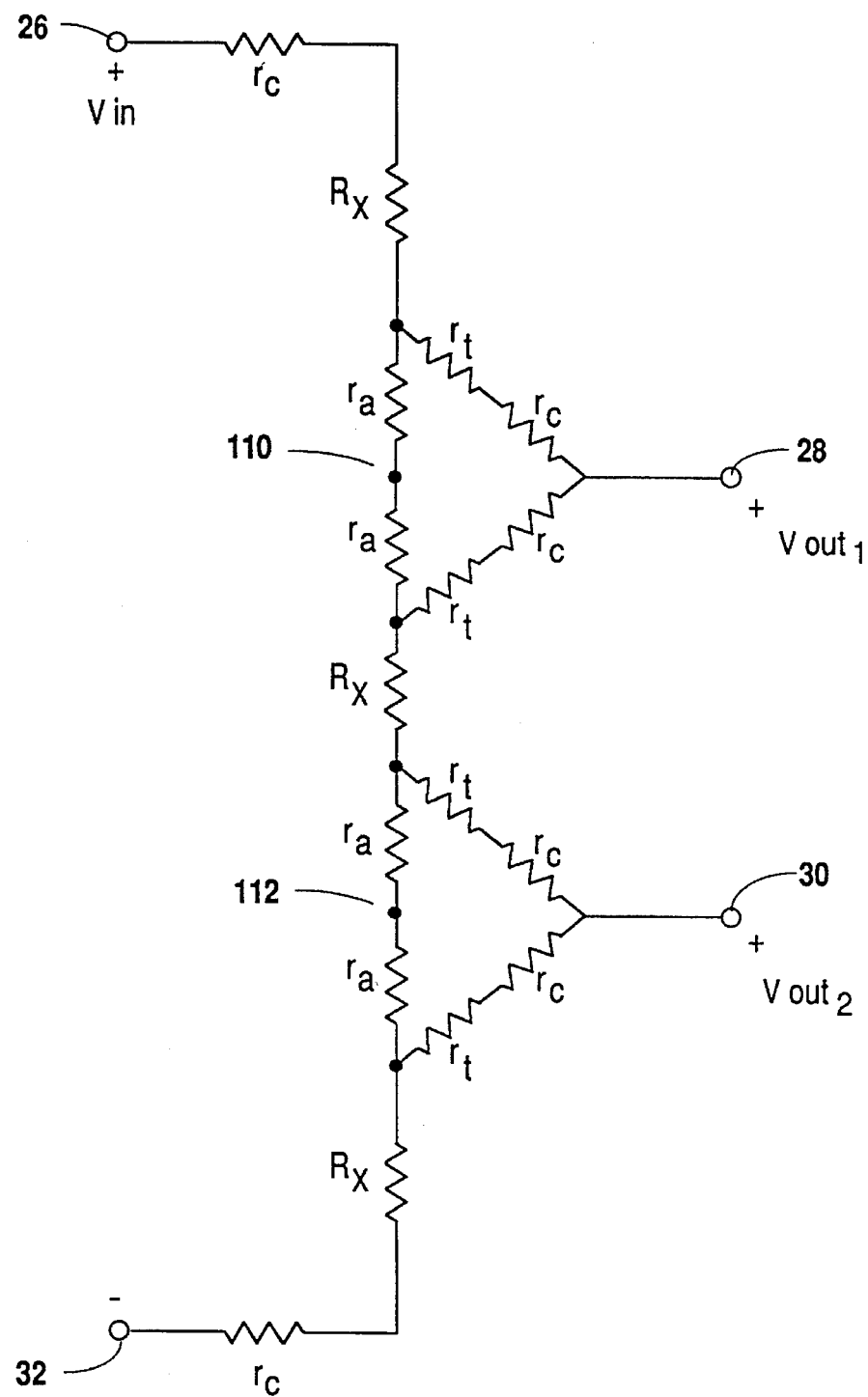
FIG. 6 is a schematic of the voltage divider shown in FIG. 5 including contact resistance.

FIG. 5 is a schematic representation of resistor voltage divider 20. Shown in FIG. 6 is the resistance effects of the interface of an interconnect contact at connection sites 26, 28, 30, and 32. The contact resistance $r_c$ is in series with tap resistance $r_t$ contact sites 28 and 30. If the contact resistance $r_c$ at connection sites 26 and 32 is small compared to $R_x$, then $r_c$ may be neglected at these two connection sites. If the contact resistance $r_c$ at connection sites 26 and 32 is significant with respect to $R_x$, the $r_c$ may be canceled out by the use of Kelvin contacts. Kelvin Contacts, well known in the art, provide a means of applying a voltage that is substantially independent of the input contact resistance.

The contact resistance $r_c$ at connection sites 28 and 30 may effect the value of $r_t$ which in turn may effect the value of the voltage divider output. Further, the contact resistance $r_c$ will have a different temperature coefficient than $r_t$, thus the overall effective tap resistance will have a different temperature coefficient than the body of the resistor. This difference in the temperature coefficient will cause a change in the divider output voltage with respect to temperature. It will be shown that regardless of the value of $r_t$, $r_t$ can be substantially compensated for with the present invention. Therefore, in the discussion that follows, only $r_t$ will be discussed and not $r_t$ plus $r_c$.

Figure 7:
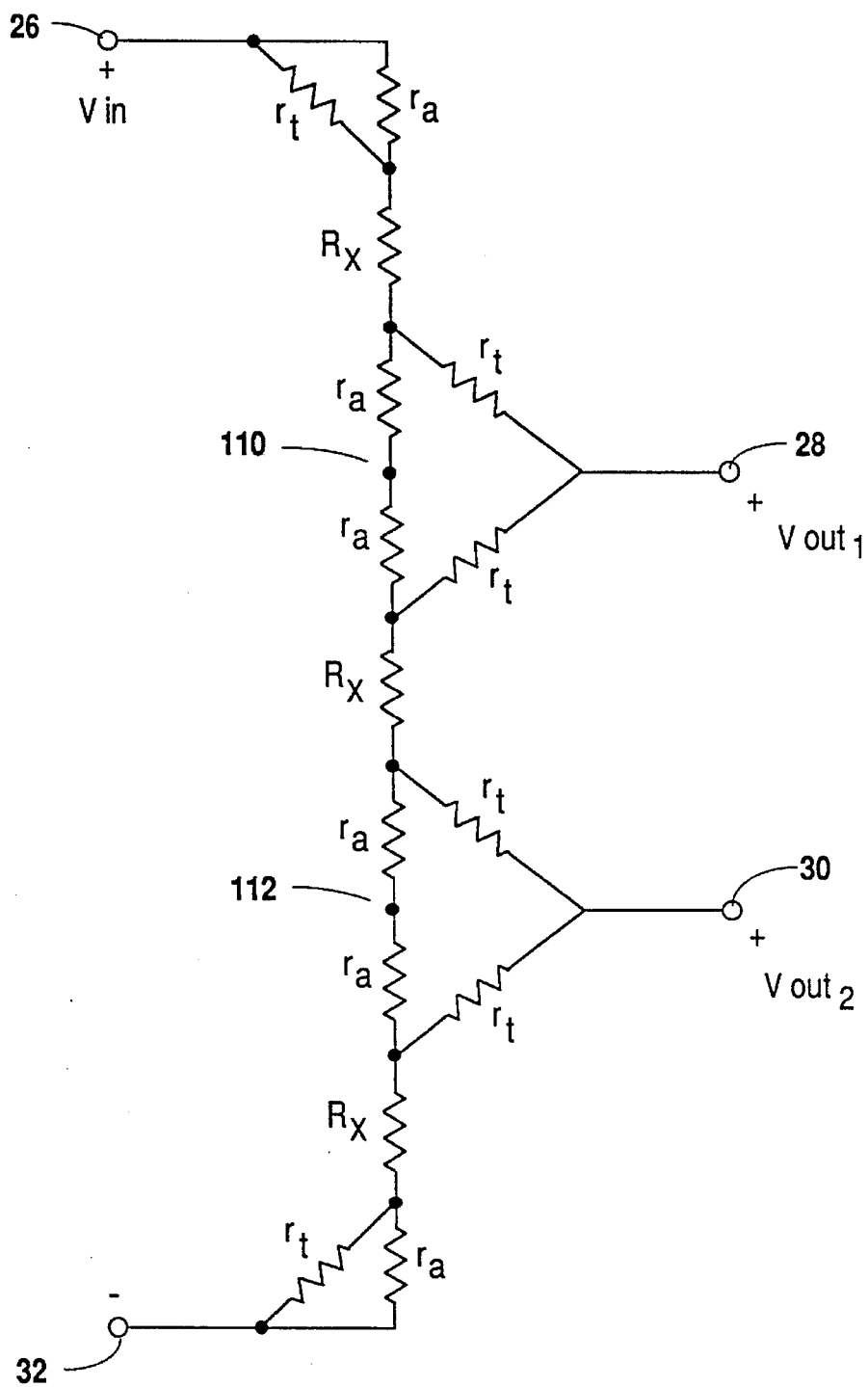
FIG. 7 is another schematic of the integrated circuit resistor voltage divider shown in FIG. 4.

Node 110 in FIGS. 5 and 6 has the same potential as tap connection site 28 and node 112 has the same potential as tap connection site 30. The circuit shown in FIG. 6 may be approximated by the circuit shown in FIG. 7. FIG. 7 is only an approximation because additional $r_a$ and $r_t$ resistors are added at each end of the voltage divider. Though three resistors, $R_x$, are shown in FIG. 7, it is understood that many $R_x$ resistors may be used. Thus, the error introduced by the approximation will be small. Furthermore, contacts 26 and 32 may be Kelvin contacts with a sense tap constructed similar to the voltage divider output taps. FIG. 7 provides a schematic representation of the voltage divider configured in this manner. Kelvin contacts, well known in the art, provide a means of applying a voltage that is independent of the input contact resistance. Thus error added by input contact impedance may be lessened by using Kelvin input contacts. The schematic of FIG. 7 may be simplified if an equivalent resistor $R_E$ is used where $R_E$ is defined in Equation 5 as:

$$R_E = R_x + 2 \frac{r_a r_t}{r_a + r_t} \tag{5}$$

Figure 8:
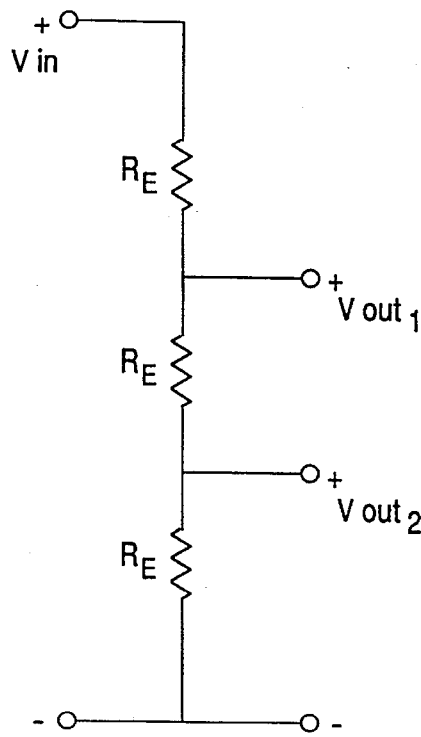
FIG. 8 is an equivalent resistor version of the schematic shown in FIG. 7.

A schematic representation using equivalent resistor $R_E$ is shown in FIG. 8.

Figure 9:
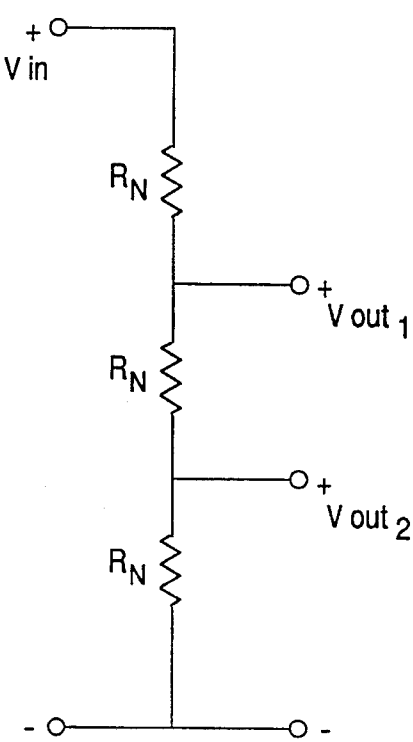
FIG. 9 is a version of the schematic shown in FIG. 7 without tap resistance.

If there was no parasitic tap resistance, $r_t$, the schematic of FIG. 7 may be shown as the schematic in FIG. 9. An equivalent resistor $R_N$ can be used as shown in FIG. 9 where $R_N$ is defined in Equation 6 as:

$$R_N = R_x + 2 r_a \tag{6}$$

Subtracting Equation 5 from Equation 6 results in a $\Delta R$ term. $\Delta R$ thus represents the change in the ideal resistor when a parasitic tap resistance, $r_t$, is considered and may be shown to be:

$$\Delta R = R_x + 2r_a - R_x - 2\frac{r_a r_t}{r_a + r_t} = 2\left(r_a - \frac{r_a r_t}{r_a + r_t}\right) \tag{7}$$

Now calculating a voltage transfer function for $Vout_1$ when parasitic tap resistances are included yields Equation 9:

$$\frac{Vout_1}{Vin} = \frac{(R_N - \Delta R) + (R_N - \Delta R)}{(R_N - \Delta R) + (R_N - \Delta R) + (R_N - \Delta R)} = \tag{9}$$

$$\frac{2(R_N - \Delta R)}{3(R_N - \Delta R)} = 2/3$$

and similarly $$\frac{Vout_2}{VIN} = \frac{R_N - \Delta R}{3(R_N - \Delta R)} = \frac{1}{3} \tag{10}$$

As noted above, the taps were equally spaced in the configurations of FIGS. 4–9, therefore, Equations 9 and 10 are only valid for equal spacing. Therefore, for linear spacing, the equations above demonstrate that the voltage transfer function will be substantially independent of the parasitic tap resistance.

Figure 10:
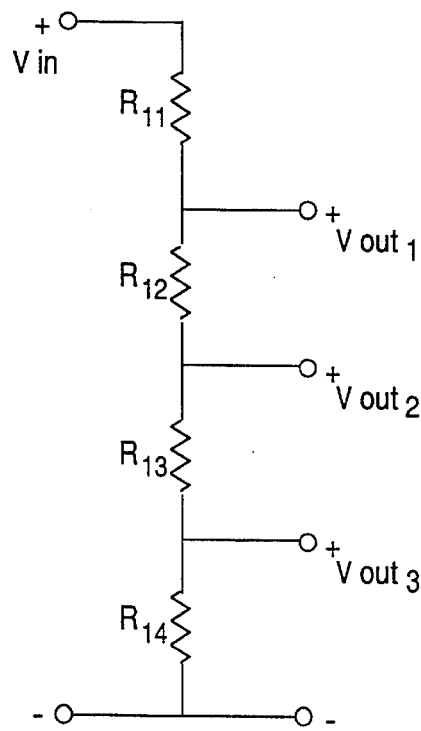
FIG. 10 is a schematic of a nonlinear integrated circuit resistor voltage divider.

A voltage divider with a nonlinearly related transfer functions may be obtained by using nonlinear spacing between the taps rather than equal (i.e. linear) spacing. For example, the spacing may follow a logarithmic pattern, square root pattern, or other patterns. FIG. 10 is schematic of a voltage divider having nonlinearly related transfer functions without including parasitic tap resistances. When a uniform width and sheet resistance are used, Equations 11a and 11b represent the voltage transfer functions:

$$\frac{Vout_1}{Vin} = \tag{11a}$$

$$\frac{R_{12} + R_{13} + R_{14}}{R_{11} + R_{12} + R_{13} + R_{14}} = \frac{L_{12} + L_{13} + L_{14}}{L_{11} + L_{12} + L_{13} + L_{14}} \tag{11a}$$

$$\frac{Vout_2}{Vin} = \tag{11b}$$

$$\frac{R_{13} + R_{14}}{R_{11} + R_{12} + R_{13} + R_{14}} = \frac{L_{13} + L_{14}}{L_{11} + L_{12} + L_{13} + L_{14}}$$

where $L_{11}$, $L_{12}$, $L_{13}$, and $L_{14}$ are nonlinearly, such as logarithmically, different lengths.

Including parasitic tap resistance as discussed above for the linear voltage divider yields a transfer function as shown in equation 12a:

$$\frac{Vout_1}{Vin} = \tag{12a}$$

$$\frac{(R_{12} - \Delta R) + (R_{13} - \Delta R) + (R_{14} - \Delta R)}{(R_{11} - \Delta R) + (R_{12} - \Delta R) + (R_{13} - \Delta R) + (R_{14} - \Delta R)}$$

Unlike the linear voltage divider, the nonlinear voltage divider with nonlinearly spaced taps has transfer functions that are not independent of the taps, because the $\Delta R$ term, and thus $r_t$, is present in the transfer function. The tap dependency of the voltage divider may be compensated for by adjusting the lengths of $L_{11}$, $L_{12}$, $L_{13}$, and $L_{14}$. However, $r_t$ may vary because $r_t$ is sensitive to temperature and process variations. For example because the tap widths are generally much smaller than the main resistor body widths, critical linewidth dimension variations during integrated circuit processing will disproportionately change the $r_t$ resistance as compared to resistance changes in the main body of the resistor. Likewise, temperature variations, may impact the voltage divider. For example, the tap resistance may be dependant on the interface resistance of a connection site within a tap as discussed above and such interface effects may have a temperature dependency. Interface effects, though, will have less impact as the length of a tap is increased. Thus, even if the resistor lengths $L_{11}$–$L_{14}$ are adjusted, error will still result due to process and temperature variations.

Using the present invention, though, it is possible to create a voltage divider with nonlinearly related transfer functions that is less sensitive to the parasitic tap resistance. In the present invention, extra inaccessible compensation taps are added such that the number of taps in each resistor segment $R_{11}$, $R_{12}$, $R_{13}$ and $R_{14}$ is proportional to the length $L_{11}$, $L_{12}$, $L_{13}$ and $L_{14}$ of each resistor segment. This will result in the ratio of the number of taps in a particular resistor segment to the total number of taps in the voltage divider being substantially equal to the ratio of the length of that particular resistor segment to the total length of the voltage divider ($L_{11}+L_{12}+L_{13}+L_{14}$).

Thus, if $\Delta R$ is expressed as $$\Delta R = \frac{T_{tot}}{L_{tot}} \times \Delta r \times L_{seg} \quad (13a)$$

where $L_{seg}$=the length of the resister segment.

$T_{tot}$=the total number of taps in the voltage divider (both desired accessible output taps and extra inaccessible compensation taps).

$L_{tot}$=the total length of the voltage divider, then Equation 12a may be rewritten as Equation 13b.

$$\frac{Vout_1}{Vin} = \frac{\left(R_{12} - \frac{T_{tot}}{L_{tot}} \Delta r L_{12}\right) + \left(R_{13} - \frac{T_{tot}}{L_{tot}} \Delta r L_{13}\right) + \left(R_{14} - \frac{T_{tot}}{L_{tot}} \Delta r L_{14}\right)}{\left(R_{11} - \frac{T_{tot}}{L_{tot}} \Delta r L_{11}\right) + \left(R_{12} - \frac{T_{tot}}{L_{tot}} \Delta r L_{12}\right) + \left(R_{13} - \frac{T_{tot}}{L_{tot}} \Delta r L_{13}\right) + \left(R_{14} - \frac{T_{tot}}{L_{tot}} \Delta r L_{14}\right)} \quad (13b)$$

In terms of sheet resistance, Equations 14a and 14b may be used:

$$\Delta r = \Omega/\square \times \frac{L_t}{W_t} \times k \quad (14a)$$

where k is a constant and $$R_n = \Omega/\square \times \frac{L_n}{W} \quad (14b)$$

where the $\Omega/\square$ in Equations 14a and 14b is the same value. Substituting Equations 14a and 14b into Equation 13 yields Equations 15a and 15b:

$$\frac{Vout_1}{Vin} = \frac{\Omega/\square \left[\left(\frac{L_2}{W} - \frac{T_{tot}}{L_{tot}} \frac{L_t}{W_t} L_{12}k\right) + \left(\frac{L_3}{W} - \frac{T_{tot}}{L_{tot}} \frac{L_t}{W_t} L_{13}k\right) + \left(\frac{L_4}{W} - \frac{T_{tot}}{L_{tot}} \frac{L_t}{W_t} L_{14}k\right)\right]}{\Omega/\square \left[\left(\frac{L_1}{W} - \frac{T_{tot}}{L_{tot}} \frac{L_t}{W_t} L_{11}k\right) + \left(\frac{L_2}{W} - \frac{T_{tot}}{L_{tot}} \frac{L_t}{W_t} L_{12}k\right) + \left(\frac{L_3}{W} - \frac{T_{tot}}{L_{tot}} \frac{L_t}{W_t} L_{13}k\right) + \left(\frac{L_4}{W} - \frac{T_{tot}}{L_{tot}} \frac{L_t}{W_t} L_{14}k\right)\right]} \quad (15a)$$

$$= \frac{(L_2+L_3+L_4)\left(\frac{1}{W} - \frac{T_{tot}}{L_{tot}} \frac{L_t}{W_t} k\right)}{(L_1+L_2+L_3+L_4)\left(\frac{1}{W} - \frac{T_{tot}}{L_{tot}} \frac{L_t}{W_t} k\right)} = \frac{L_2+L_3+L_4}{L_1+L_2+L_3+L_4} \quad (15b)$$

Thus as shown in Equations 15a and 15b, the effect of the parasitic tap resistances may be substantially compensated for by adding extra inaccessible compensation taps, and the resulting transfer function is substantially independent of the parasitic resistances. Furthermore, the taps do not have to be linearly spaced. The requirement that the number of taps in each segment be proportional to the length of each segment has to be valid only at the accessible output taps of interest and not at each extra inaccessible compensation tap. Thus, all the taps in one segment may be lumped at one end of the segment, or they may be linearly spaced, or any combination of the two methods.

Figure 11:
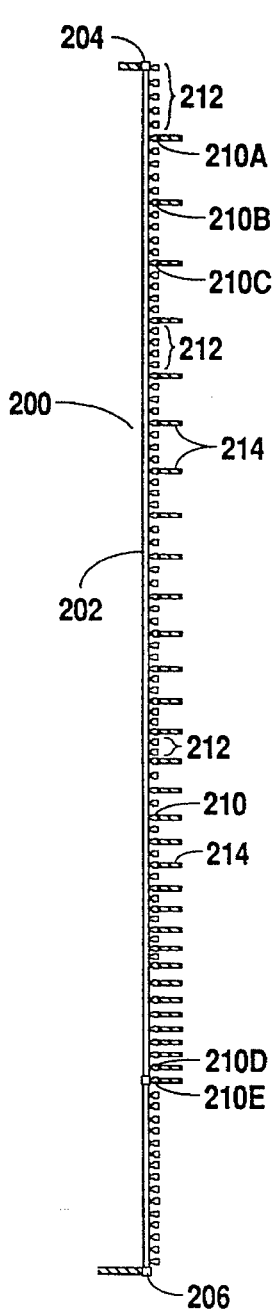
FIG. 11 is a plan view of a integrated circuit resistor voltage divider according to the present invention.
Figure 12:
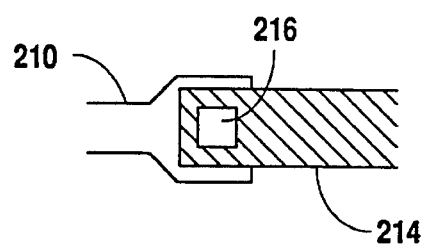
FIG. 12 is an expanded view of a tap shown in FIG. 11.

A resistor according to one embodiment of the present invention is shown in FIG. 11. Resistor 200 is comprised of resistor body 202, accessible output taps 210, inaccessible compensation taps 212, and two input connections. Generally one input will be connected to a voltage source and one input will be connected to a ground. However, a ground connection is not required, but rather the second input may be at some other user determined voltage state. In a preferred embodiment, though, input connections of voltage connection 204 and ground connection 206 are provided. FIG. 12 is an expanded view of one accessible output tap 210. Accessible output tap 210 has a contact site 216. Electrical lead 214 is shown in FIG. 12 to illustrate an electrical connection to accessible output tap 210. Electrical lead 214 may be, for example, an aluminum lead.

Resistor body 202 may be, for example, constructed from 3 micron wide polysilicon and the resistor taps may have a total width of 1.5 microns each and a length of 4microns. It is recognized that other dimensions and materials may be utilized depending on a users specific electrical and space requirements. Thus, the specific dimensions shown in the figures herein are used for illustrative purposes to aid the understanding of the present invention.

As shown in FIG. 11, each accessible output tap 210 is connected with an electrical lead 214 and, thus, resistor 200 has thirty-two accessible output taps 210. It is understood that electrical leads 214 are part of the additional circuitry, such as decoding circuitry, (not shown) that a user may utilize to decode a desired accessible output tap. Inaccessible compensation taps 212 may be found between accessible output taps 210. Inaccessible compensation taps 212 are not connected to electrical leads 214 and are, therefore, not selectable as outputs for the voltage divider. Inaccessible compensation taps 212, however, will lessen the effect of tap resistance as described above. Although inaccessible compensation taps preferable are not connected to electrical leads such as electrical leads 214, in a preferred embodiment inaccessible compensation taps 212 have contact sites 216 that are filled with a contact plug or a small stub of an electrical lead comprising the same material as electric leads 214. A contact plug or a stub will better simulate the interface resistance effects of electric leads 214 such that the resistance of inaccessible compensation taps 212 more closely resembles the resistance of accessible output taps 210.

Alternatively, electrical leads 214 may be connected to every lead. In this embodiment, though, inaccessible compensation taps are still inaccessible because at some point in the decoding circuitry, the structural interconnects required to access the inaccessible compensation taps will be missing. A user, therefore, will not be able to select some taps as either an output or an input. Thus, space requirements and circuit complexity are decreased because every tap does not require corresponding complete input or decoding circuitry.

Furthermore, the invention provides advantages over circuits in which every tap may be accessed and the user selects the desired tap through user inputs. For example, resistor 200 of the present invention only requires circuitry necessary to access thirty-two taps. If every tap in resistor 200 was accessible and a user chose the desired output taps via user inputs or software as in the prior art, circuitry necessary to access all 103 taps would be required.

Accessible output taps 210 are generally nonlinearly spaced along resistor body 202 in order to provide nonlinearly related voltage outputs. The amount of attenuation between each accessible output tap will vary depending on the user's placement of the accessible output taps for the desired application. A user may also select a desired nonlinear attenuation pattern through the placement of the accessible output taps. For example, accessible outputs may be spaced so that the voltage transfer function follows a logarithmic pattern, square root pattern, inverse pattern or other user selected linear and nonlinear patterns. Nonlinear spacing may even be created by linearly spacing taps over only a portion of the voltage divider. For example, nonlinear spacing is the net effect of a voltage divider that has no taps over the top half of the resistor body and linear spaced taps over the bottom half.

FIG. 11 shows a logarithmic accessible output spacing pattern as one embodiment of the present invention. Accessible output taps 210 are spaced to provide 0.5 db attenuation steps between each accessible output tap. The transfer function of $$\frac{Vout}{Vin}$$

may be expressed in decibels, db, by taking the log of $$\frac{Vout}{Vin}$$

and multiplying the results by 20. Thus, accessible output tap 210A provides 0.5 db attenuation from voltage connection 204 while accessible output tap 210E provides 16db attenuation. If resistor body 202 is 1000 microns long from voltage connection 204 to ground connection 206, then, accessible output tap 210A is placed approximately 55.9 microns from voltage connection 204 and accessible output tap 210E is placed approximately 841.5 microns from input connection 204 in order to achieve the desired attenuation at the accessible output taps. The distances such as 55.9 and 841.5 microns may be chosen by using the sheet resistance length and width and assuming ideal resistor conditions without compensating for parasitic tap resistances. Likewise, the remaining accessible output taps are placed to provide the desired attenuation steps.

According to the present invention, the number of taps (including both accessible output and inaccessible compensation taps) in each resistor segment is substantially proportional to the length of each resistor segment. By having an average tap density that is substantially uniform across the length of resistor body 202, the tap impedance effects will be lessened. As used herein, tap density is the number of all taps, accessible and inaccessible together, over a chosen length of the resistor body. In resistor 200, inaccessible compensation taps 212 are, therefore, added between logarithmically spaced accessible output taps 210 in order to maintain a substantially proportional number of total taps (accessible output taps plus inaccessible compensation taps) per unit length of resistor body 202. In resistor 200, for example, a tap density of 1 tap per 10 microns is substantially maintained along the length of resistor body 202. Therefore, numerous inaccessible compensation taps 212 are placed along resistor body 202 between the accessible output taps 210 in order to best maintain the chosen tap density. The choice of tap density will depend on the accuracy requirements, space requirements and manufacturing abilities of the user.

Slight rounding and approximation error may result when the distance between two accessible output taps does not allow an exactly integral number of taps per unit length chosen (ten microns in this example). As seen in FIG. 11, accessible output taps 210A and 210B are 52.8 microns apart and, thus, four inaccessible compensation taps 212 are placed between accessible output taps 210A and 210B and the tap density is one tap per 10.56 microns. Thus, an approximation error results between the desired tap density (one tap per ten microns in the example shown) and the actual density between accessible output taps 210A and 210B. This error may at times be small, though, as seen between accessible output taps 210B and 210C which are 49.9 microns apart and have four inaccessible compensation taps between them and thus yield a tap density of one tap per 9.98 microns. The error between two adjacent taps may increase when the distance between the taps does not provide an accurate placement of inaccessible compensation taps. For example, if the desired tap density is one tap per ten microns and two accessible output taps are spaced by 16 microns, then placing one inaccessible compensation tap between the two accessible output taps will create a density of one tap per eight microns at this segment of the resistor. If the distance between two taps is 13 microns, not placing compensation tap results in one tap per thirteen microns at this segment of the resistor, an error that is less than the error if a compensation tap was placed between the accessible output taps. However, this error for one segment will not be as significant when the tap density over larger portions of the resistor such as three, four or more times the unit length of the tap density are considered. The resulting running average of the tap density is substantially constant as different portions of the resistor are viewed It is important to note that the impact of this approximation error is diminished because the overall number of taps per unit length between any given accessible output tap and an input connection, such as ground connection 206 (i.e. the net resistor that is formed from the given accessible output to the ground connection), will be substantially constant. Accessible output taps 210A, 210B and 210E reflect this concept because between accessible output tap 210A and ground connection 206 there is one tap per 9.97 microns, between accessible output tap 210B and ground connection 206 there is one tap per 9.94 microns and between accessible output tap 210E and ground connection 206 there is one tap per 10.06 microns. Likewise, it can be shown that between the accessible output taps and input voltage connection 204 the error from the desired tap density will also be diminished. Thus, although a particular portion of the resistor may not maintain a substantially constant tap density, the net tap density along the whole resistor body and the tap density between any given accessible output tap and an input connection will average to be substantially constant. Thus, the impact of the resistance on the transfer function will be minimized.

It is understood that higher transfer function accuracy may occur as the chosen tap density is increased. However, the obtained improvements must be balanced against a manufacturer's linewidth process capabilities and circuit requirements. Also, it is believed that as taps become too close current spreading effects may cause additional error depending on the geometry of the specific voltage divider. Therefore, current spreading effects may also influence the choice of tap density and the position of taps. For example, in resistor 200, taps are not placed closer than approximately 7.4 microns. Therefore, because the 12.0 db and 12.5 db attenuation accessible output taps are 14.1 microns apart, an inaccessible compensation tap is not placed between the 12.0 db and 12.5 db points in order to avoid current spreading effects. The chosen tap density will, thus, depend on the optimization of multiple factors that may vary between specific intended uses or applications.

Figure 13:
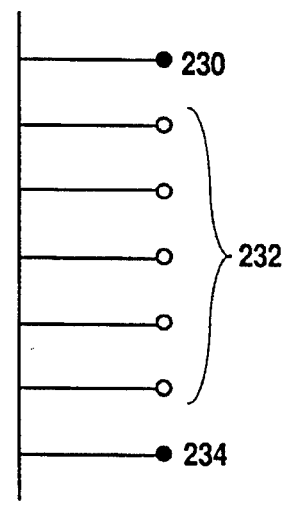
FIG. 13 shows linear spaced inaccessible compensation taps.
Figure 14:
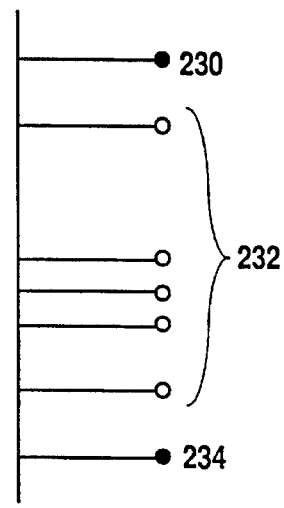
FIG. 14 shows nonlinear spaced inaccessible compensation taps.

Because it is desired to create a substantially constant average tap density between accessible output taps, the inaccessible compensation taps between accessible output taps do not have to be linearly spaced. FIGS. 13 and 14 show a portion of a resistor made in accordance with the present invention. In FIG. 13, inaccessible compensation taps 232 are linearly spaced between accessible output taps 230 and 234. In FIG. 14, inaccessible compensation taps 232 are nonlinearly spaced between accessible output taps 230 and 234. However, the average tap density per unit length between accessible taps in the resistor segment shown in both FIGS. 13 and 14 is the same and either arrangement would have a similar effect as used in the present invention.

Figure 15:
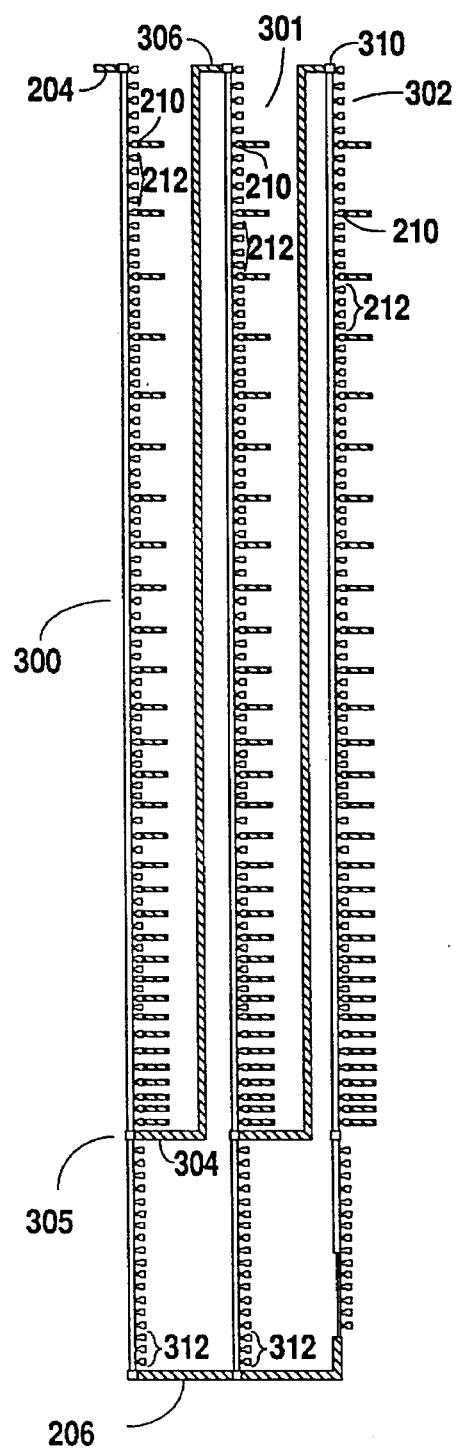
FIG. 15 shows multiple integrated circuit resistor voltage dividers connected according to the present invention.

A group of resistors such as resistor 200 in FIG. 11 may be connected as shown in FIG. 15. In FIG. 15, resistors 300, 301, and 302 each have ground connection 206, accessible output taps 210 and inaccessible compensation taps 212. Resistor 300 has voltage connection 204. Resistor 301 is connected to resistor 300 through connector 304. Connector 304 is preferably a low resistance material such as aluminum. Connector 304 is electrically connected to resistor 300 at contact 305 and connected to resistor 301 at contact 306. Resistor 301 is, therefore, in parallel with the bottom resistive portion of resistor 300 which is between contact 305 and ground connection 206 of resistor 300. Resistor 302 may be similarly connected to resistor 301.

Resistors 300 and 301 are 1033 microns long from voltage connection 204 to ground connection 206 and contact 305 to ground connection 206 respectively. Resistor 302, the last resistor in the chain of resistors, is 1000 microns from contact 310 to ground connection 206, thus, resistor 302 is slightly shorter than the other resistors because no resistors are placed in parallel with the bottom portion of resistor 302. Additional length is added to all resistors except the last resistor in the chain in order to compensate for the subsequent resistors placed in parallel with the bottom portion of each resistor. The effective resistance from one end of resistor 302 to the opposite end of resistor 302 is therefore approximately equivalent to the resistance seen between the top of resistor 300 and ground. As seen in FIG. 15, three additional inaccessible compensation taps 312 are added to the 33 microns of additional length of resistors 300 and 301. Furthermore, the placement of accessible compensation taps 210 in resistors 300 and 301 is calculated independent of the additional length added to these resistors. Thus for each resistor, accessible output taps 210 are placed the same distances from the top of each resistor (i.e. voltage connection 204 for resistor 300, contact 306 for resistor 301, and contact 310 for resistor 302) as shown in FIG. 15.

By connecting multiple resistors in parallel as shown in FIG. 15, additional attenuation may be achieved. For example, similar to resistor 200 of FIG. 11, resistor 300 may provide accessible output taps for 0.5 to 16 db attenuation. Resistor 301 may then provide accessible outputs for 16.5 to 32 db attenuation and resistor 302 may provide accessible outputs for 32.5 to 48 db attenuation. More resistors may be added in this manner in order to achieve even higher attenuation.

Figure 17:
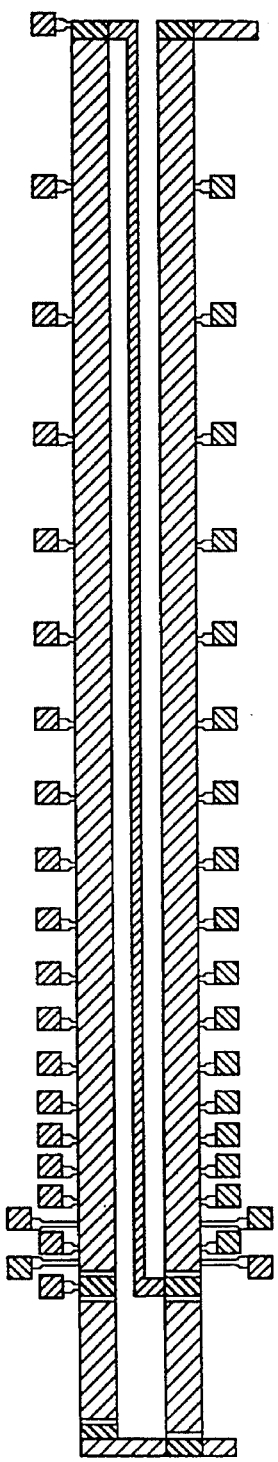
FIG. 17 is a plan view of the resistor voltage divider without inaccessible compensation taps used to generate the data shown in FIG. 16.
Figure 16:
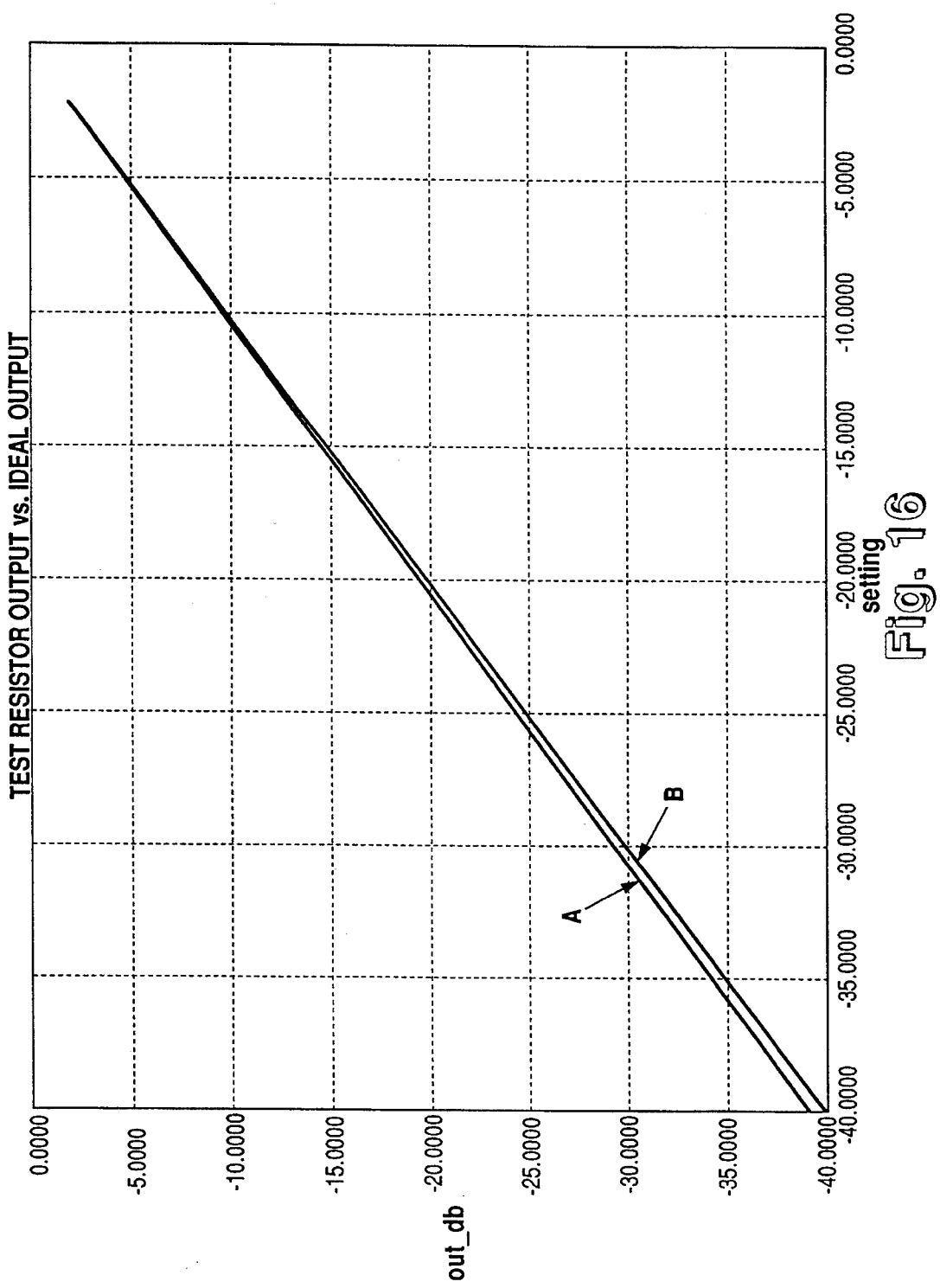
FIG. 16 shows a graph of the measured attenuation verses ideal attenuation of an integrated circuit resistor voltage divider without inaccessible compensation taps.
Figure 19:
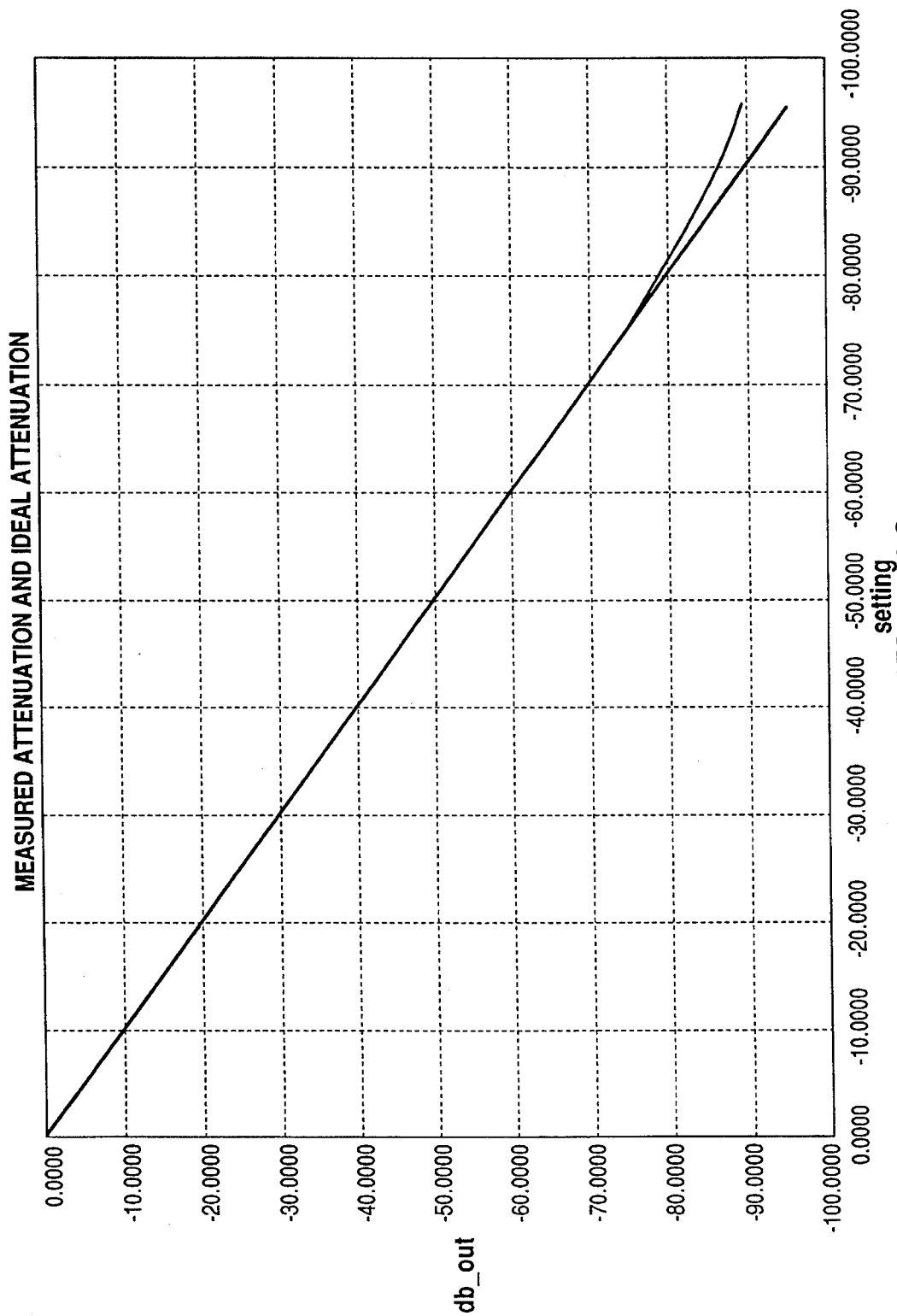
FIG. 19 is an expanded graph of the graph shown in FIG. 18.

The advantages resulting from adding inaccessible compensation taps may be seen by comparing the measured attenuation verses ideal logarithmic attenuation plot for both logarithmic resistors with and without inaccessible compensation taps. FIG. 16 shows the ideal verses measured attenuation plot for the logarithmic voltage divider shown in FIG. 17 which does not include inaccessible compensation taps. In FIG. 16, line B represents the ideal plot and line A represents the measured data. FIG. 18 shows a comparable ideal verses measured attenuation plot for using the present invention with inaccessible compensation taps. In FIG. 18, the ideal plot and measured data generally overlap. The data shown in FIG. 18 may be obtained by using six resistors such as resistor 200 in FIG. 11 and connecting the resistors in the manner shown in FIG. 15. As can be seen by comparing FIGS. 16 and 18, increased accuracy may be obtained by adding inaccessible compensation taps. Because FIG. 18 is generated from six 16 db voltage dividers, a total of 96 db attenuation may be obtained. FIG. 19 demonstrates the measured verse ideal attenuation over the entire range of the 96 db voltage divider.

Voltage dividers that do not utilize side taps but rather place taps directly within the main body of the resistor, such as resistor 1 shown in FIG. 1, may also utilize the advantages of the present invention. In FIG. 1, each tap 2 will cause a variation from the ideal electrical attenuation characteristics of resistor 1. By adding extra inaccessible compensation taps, the variation from the ideal attenuation may be lessened. Similar to the placement of side taps, it is desirable to place extra inaccessible compensation taps that are within the resistor body such that at each accessible output tap the number of taps in each resistor segment is substantially proportional to the length of each segment. Thus, the advantages of the present invention are not limited to side extensions but also may be used in other tap or contact arrangements.

Figure 20:
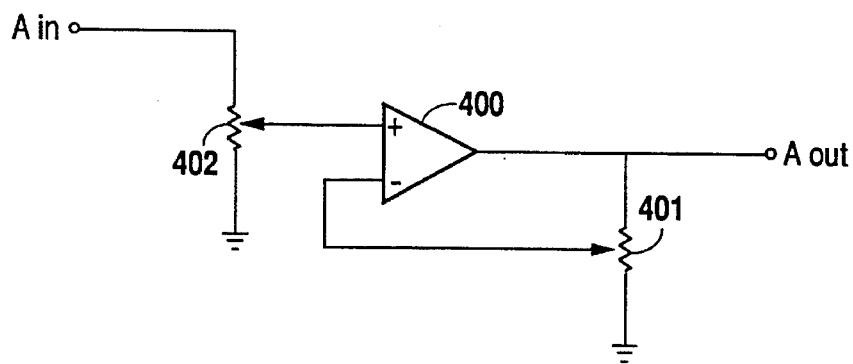
FIG. 20 is an amplifier circuit according to the present invention.

The voltage divider of the present invention also provides improved accuracy that is useful in amplifier circuits. FIG. 20 shows amplifier 400 connected with voltage dividers 401 and 402. Voltage dividers 401 and 402 are resistor voltage dividers such as resistor 200 of FIG. 11 or multiple resistors connected as shown in FIG. 15. Voltage divider 401 is connected to the inverting feedback input of amplifier 400 and voltage divider 402 is connected to the noninverting signal input of amplifier 400 in order to operate and control the amplifier output. The improved accuracy in controlling the amplifier input signal $A_{in}$ with voltage divider 402 and controlling the amplifier gain with voltage divider 401 provides a more accurate amplifier output signal $A_{out}$.

Various types of amplifiers may be used for amplifier 400. Further, the advantages gained by using the voltage divider of the present invention are not dependant upon using a specific amplifier, but rather the voltage divider may be used with many different amplifiers or other circuits. In one embodiment amplifier 400, as shown in FIG. 20, may be an amplifier such as amplifier 800 shown in the generalized block diagram in FIG. 24 and further described in FIGS. 25 and 26. The "+" and "−" terminals of amplifier 400 correspond to the "IN+" and "IN−" terminals of amplifier 800 as shown in FIG. 26.

Figure 24:
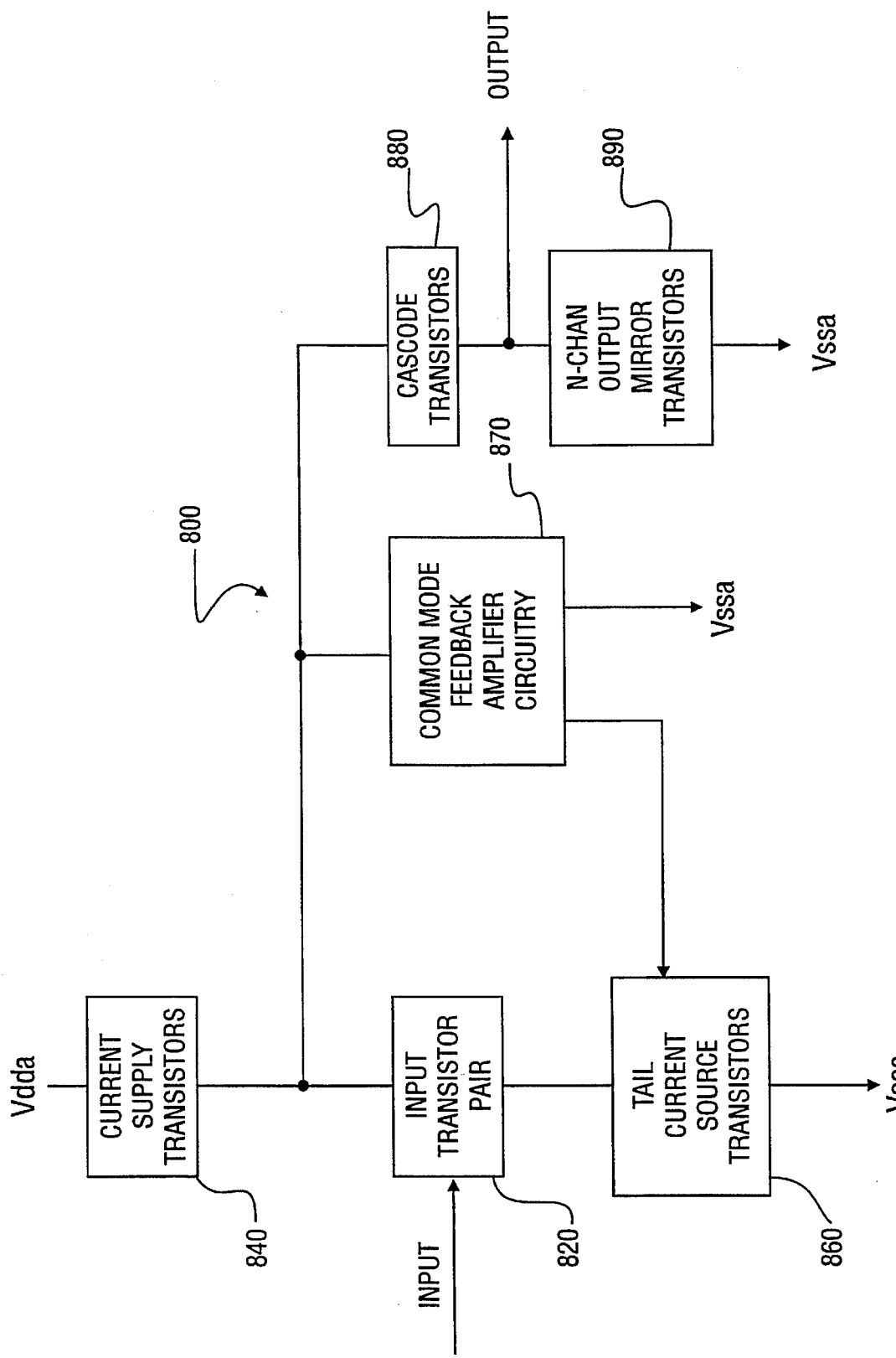
FIG. 24 is a block diagram of an amplifier of the present invention.

As shown in FIG. 24, inputs are supplied to an input transistor pair 820 of amplifier 800. Connected to input transistor pair 820 are current supply transistors 840 and tail current source transistors 860. Tail current source transistors 860 provide a current sink to voltage supply $V_{ssa}$. The output of amplifier 800 is provided through cascode transistors 880. N-Channel output mirror transistors 890 mirror currents flowing through some of cascode transistors 880.

Also connected to current supply transistors 840 is a common mode feedback amplifier circuitry 870. Common mode feedback amplifier circuitry 870 interacts with the tail current source transistors 860 to compensate for errors introduced by a changing input common mode signal.

Amplifier 800 may be conceptualized as two amplifiers in one. One amplifier acts on the input differential signal and includes input transistor pair 820, cascode transistors 880 and n-channel output mirror transistors 890. The other amplifier acts on the varying input common mode voltage and includes common mode feedback amplifier circuitry 870.

Figure 25:
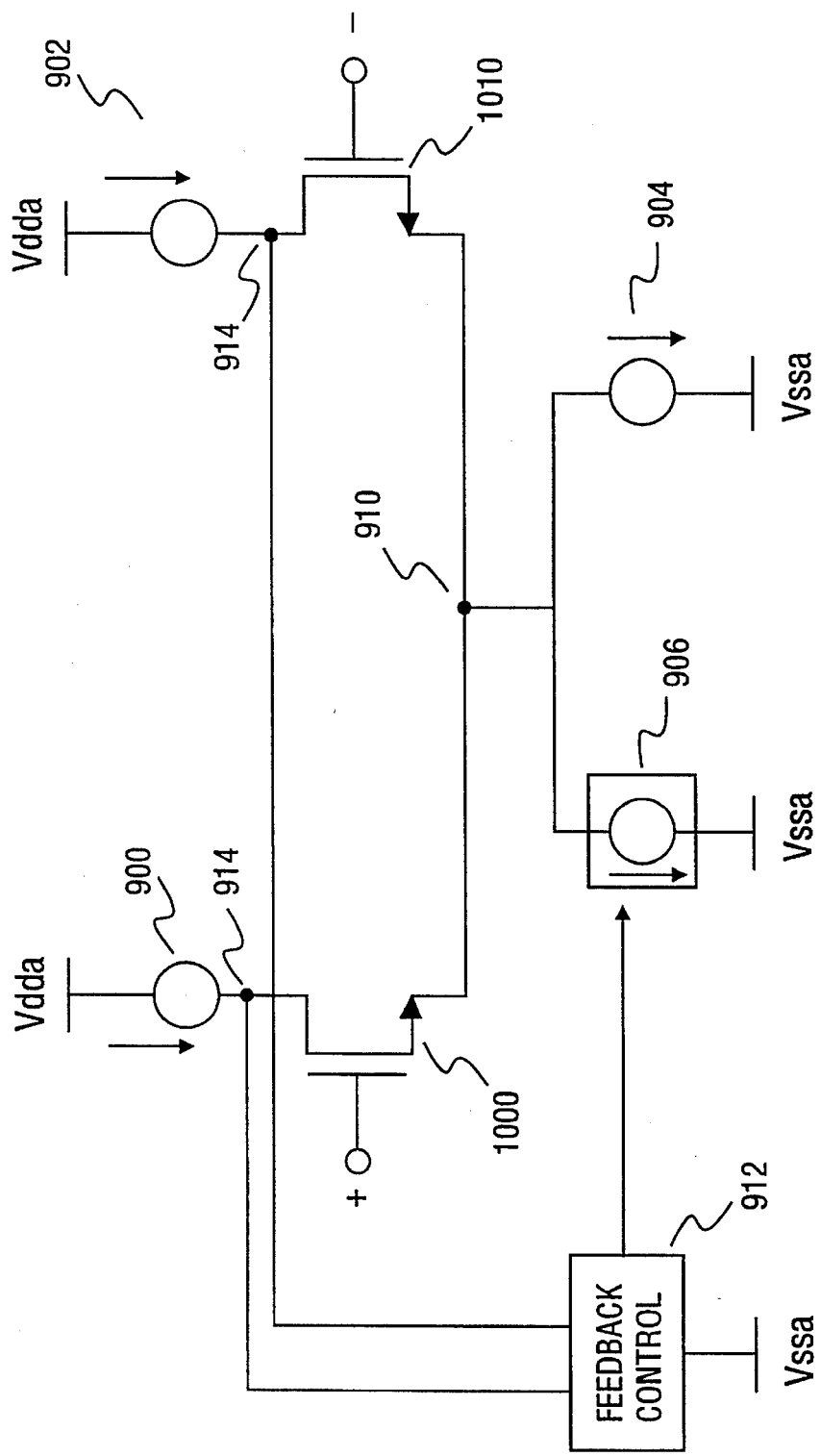
FIG. 25 is another diagram of the amplifier of FIG. 24.
Figure 26:
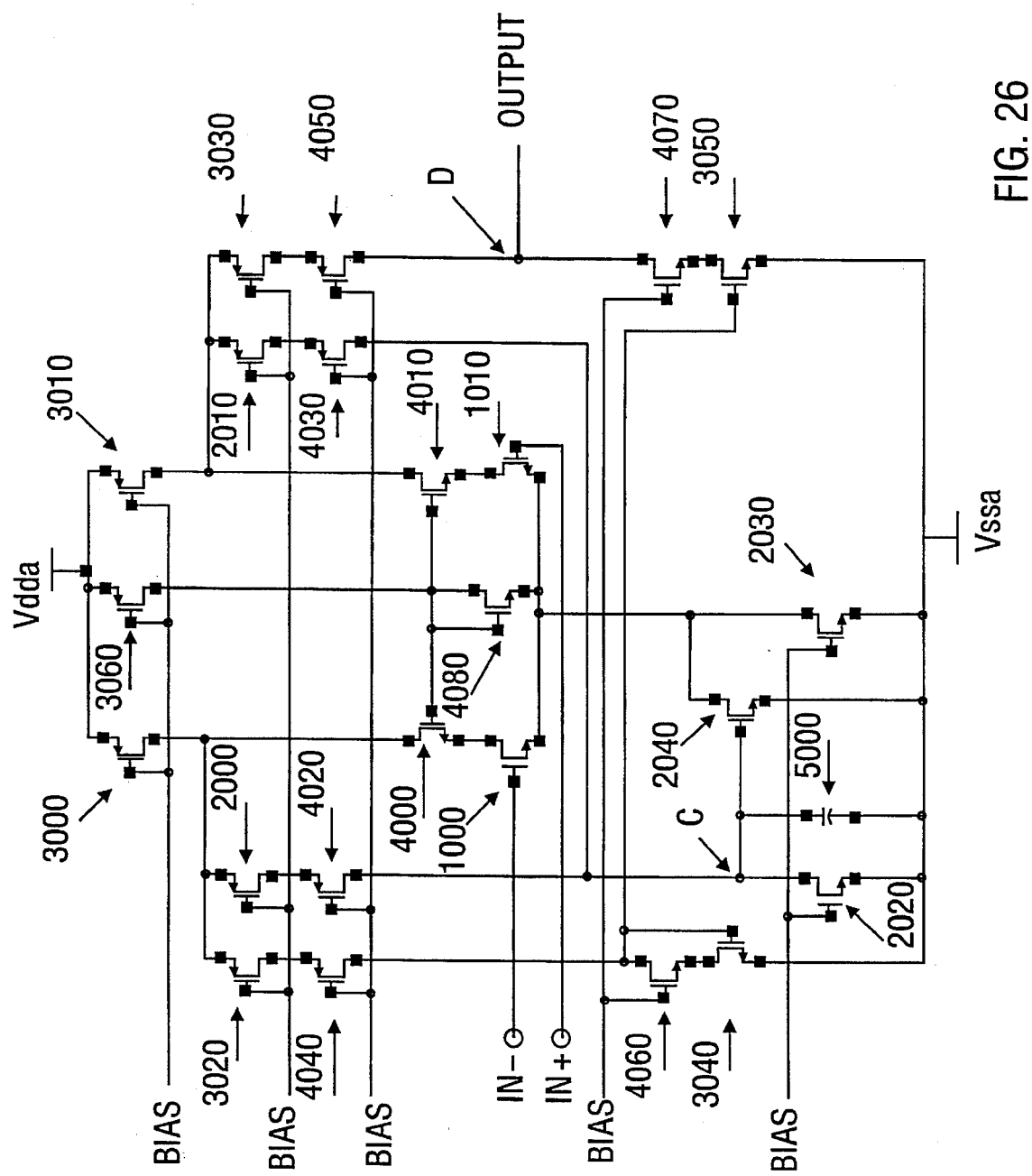
FIG. 26 is a schematic diagram of an amplifier of the present invention.

Another generalized block diagram of amplifier 800 is shown in FIG. 25. The gates of two n-channel differential input transistors 1000 and 1010 are connected to a positive input and a negative input respectively. A constant current source 900 is connected to the drain of transistor 1000 and a constant current source 902 is connected to the drain of transistor 1010. The sources of transistors 1000 and 1010 are connected at a common node 910. Also connected to common node 910 is a current source 904. Current source 904 is also connected to $V_{ssa}$ and provides a current sink for the differential input transistors.

Signal distortion problems due to a common mode signal are minimized through the use of common mode feedback control circuitry 912. Common mode feedback control circuitry 912 is also connected to current sources 900 and 902 and senses the currents at nodes 914. In response to the sensed currents, common mode feedback control circuitry adjusts a variable current source 906. Variable current source 906 sinks a varying current to $V_{ssa}$ such that the current through transistors 1000 and 1010 is maintained at a constant $I_D$ even under common mode signal conditions and independent of variations in the current source.

Referring now to FIG. 26, a schematic of an embodiment of an amplifier according to the present invention is shown. This amplifier has a topology somewhat similar to a "folded-cascode" amplifier but also includes a common mode feedback loop.

In FIG. 26, transistors 1000 and 1010 form the input differential transistor pair. Transistors 2030 and 2040 combine together to form the tail current source for the input differential pair and are both connected to a negative supply voltage $V_{ssa}$. Transistor 2030 has a fixed dc gate bias voltage, while transistor 2040 has a variable gate bias voltage. The gate bias voltage of transistor 2040 is varied in a negative feedback fashion to compensate for a varying input common mode signal.

Transistors 3000 and 3010, similar to the "folded-cascode" amplifier transistors 3000A and 3010A, supply a current from a positive supply voltage $V_{dda}$ to the drain connection of the input pair transistors 1000 and 1010, and also to the source connection of transistors 3020, and 3030. The amplifier according to the present invention also utilizes transistors 2000 and 2010 which are not present in the "folded-cascode" amplifier. The source connections of transistors 2000 and 2010 also have current supplied to them by transistors 3000 and 3010.

Transistors 3040 and 3050 form a current mirror. Therefore, the current flowing in transistor 3020 is mirrored to the output leg of the differential amplifier by transistors 3040 and 3050. The output current of the differential amplifier is the current flowing in transistor 3030 minus the current flowing in transistor 3020.

Transistors 4000, 4010, 4020, 4030, 4040, 4050, 4060, and 4070 are cascode transistors and are not required for this amplifier to operate. However, advantages of adding these transistors include an improvement of the intrinsic offset of the amplifier and an increase in the dc gain of the amplifier. Another advantage of adding transistors 4000 and 4010 is that the gate bias voltage of these two transistors may be slaved to the input common mode voltage. This results in the drain to source voltage of transistors 1000 and 1010 not changing with a changing input common mode signal. Transistor 3060 and 4080 form such a gate bias voltage of transistors 4000 and 4010.

Transistors 2000 and 2010 form the input to the common mode feedback portion amplifier. Ideally the value of current flowing in transistor 2000 is a small fraction of the current flowing in transistor 3020. Likewise, the current flowing in transistor 2010 is a small fraction of the current flowing in transistor 3030. The ratio of the current flowing in transistor 3020 to the current flowing in transistor 2000 is the same ratio as the current flowing in transistor 3030 to the current flowing in transistor 2010. The currents in transistors 2000 and 2010 are summed together at node "C". If the sum of these currents is larger than the current through transistor 2020, then the current through transistor 204 increases since the drain voltage on transistor 2020 (i.e., the gate voltage on transistor 2040) controls the current flowing in transistor 2040. Thus, transistor 2020 which acts as a current source load for the common made feedback portion of the amplifier, also interacts with the gate of the variable current sink of the differential portion of the amplifier (transistor 204).

The common mode feedback portion of the amplifier is made up of transistors 2000, 2010, 2020, 2040, 4020, and 4030. The transistors that form the portion of the amplifier that acts on the differential input signal and produces an output signal that is an amplified version of the differential input signal are transistors 1000, 1010, 3020, 3030, 3040, 3050, 4000, 4010, 4040, 4050, 4060, and 4070. Transistors 3000, 3010, and 2030 are dc bias transistors common to both portions of the amplifiers. Transistors 3060 and 4080 form the gate bias voltage for transistors 4000 and 4010.

The common mode feedback works in the following fashion. A differential input signal present at the gate of transistors 1000 and 1010 will cause the current flowing in transistors 2000 and 2010 to flow in opposition with each other. That is, a differential input signal that causes the current in transistor 2010 to increase will cause the current in transistor 2000 to decrease by a like amount. When the currents in transistor 2000 and 2010 are summed together, there is no net change in the total current. Therefore, the gate voltage on transistor 2040 does not change.

A changing input common mode signal present at the gate of transistors 1000 and 1010 will cause the currents in transistors 2000 and 2010 to change together and not in opposition with each other. Thus, when an input common mode signal causes an increase in the current flowing in transistors 2000 and 2010 the gate voltage of transistor 2040 will increase which causes the current in transistor 2040 to increase. An increase in the current of transistor 2040 will result in a decrease in the current flowing in transistors 2000 and 2010. This negative feedback action of transistor 2040 will compensate for errors introduced into the differential signal path caused by a changing input common mode signal.

The common mode feedback portion of the amplifier has a single low frequency pole which is present at node "C", as shown in FIG. 26. Capacitor 5000, for example 1 pf, is used to compensate the common mode feedback amplifier in order to make it stable and not oscillate.

The input differential portion of the amplifier has a single low frequency pole which is present at the amplifier output node "D". The independence of the frequency response of these two different portions of the amplifier allows optimization of both amplifier portions without effecting the performance of the other. The composite response of both amplifier portions results in an overall amplifier performance which has a good high frequency input common mode rejection ratio. This amplifier also maintains the same large input common mode range as the previous art "folded-cascode" amplifier.

Figure 21:
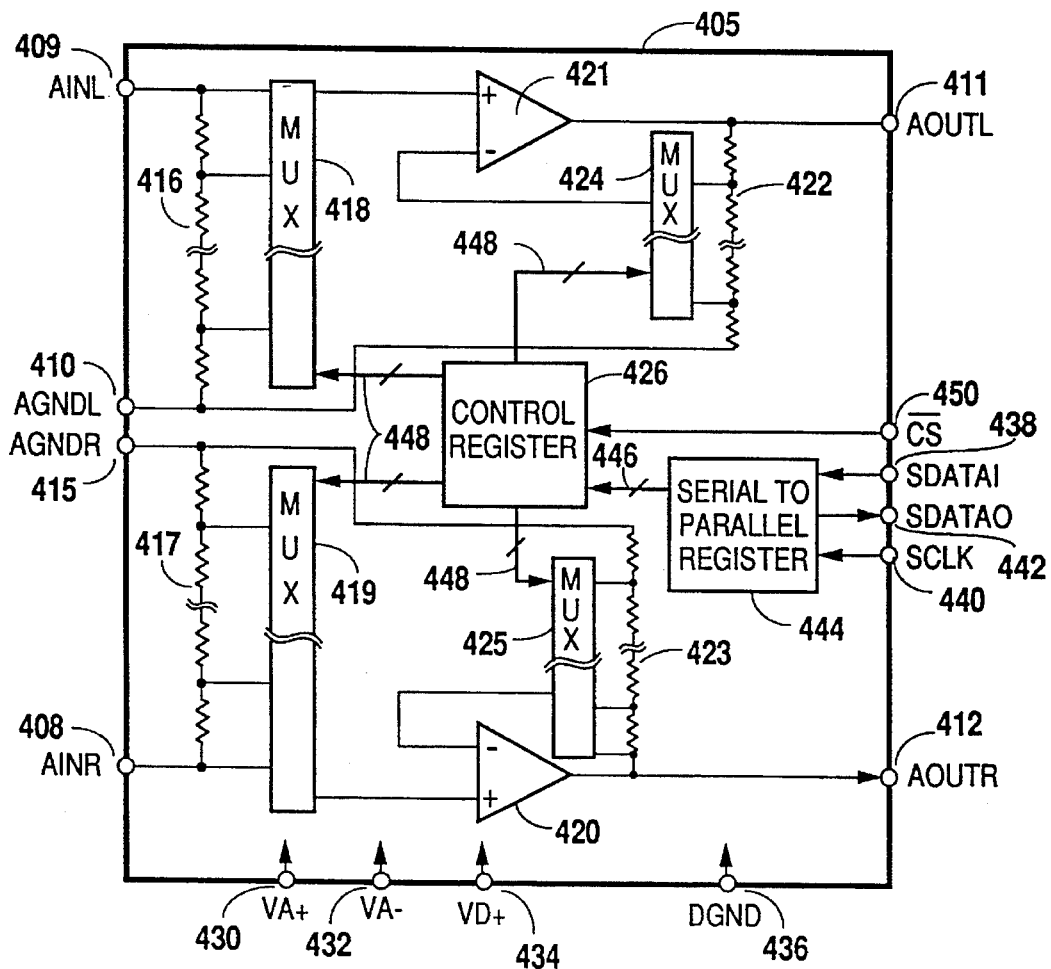
FIG. 21 is a volume control circuit according to the present invention.
Figure 22:
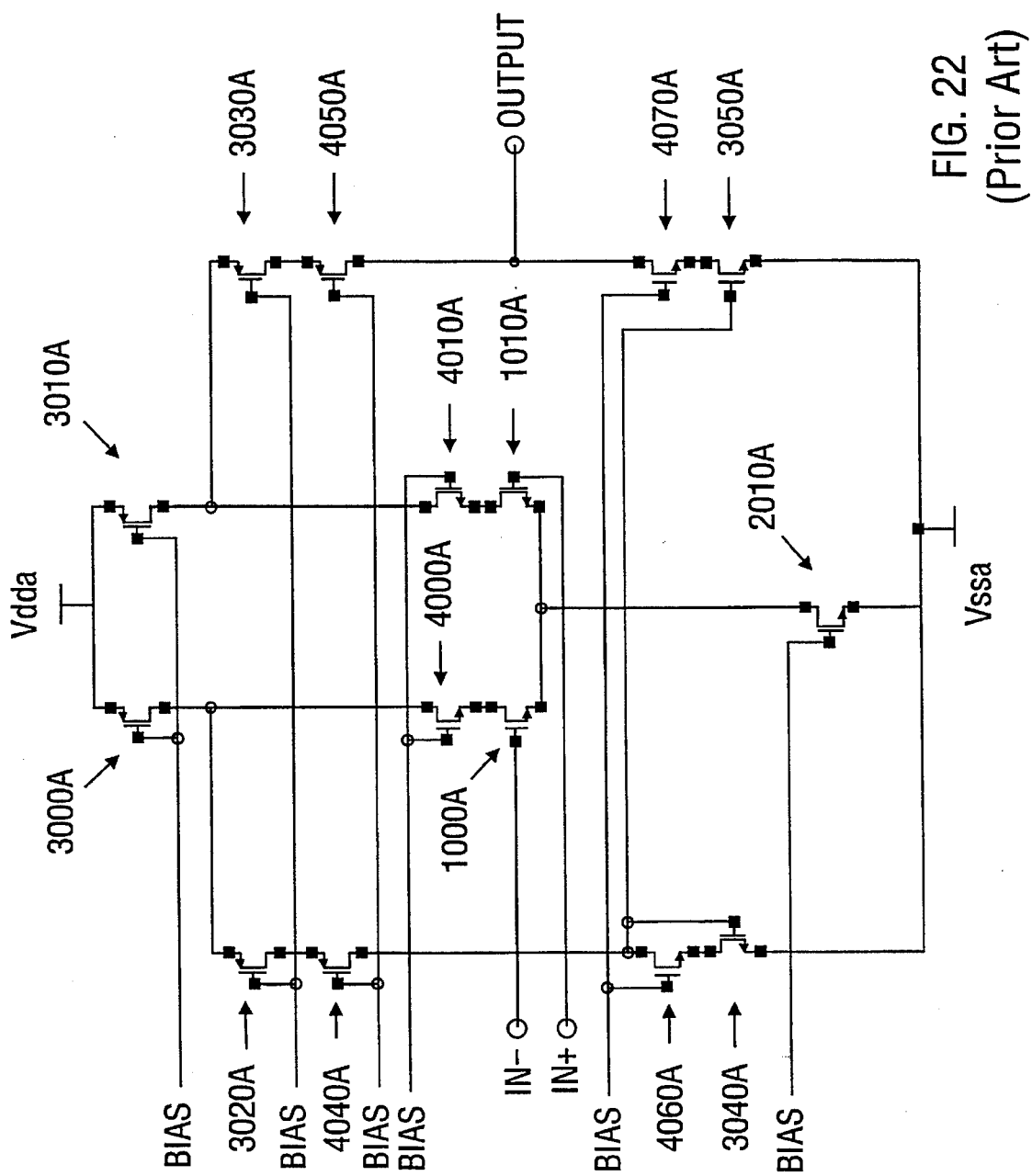
FIG. 22 is a schematic diagram of a prior art "foldedcascode" amplifier.
Figure 23:
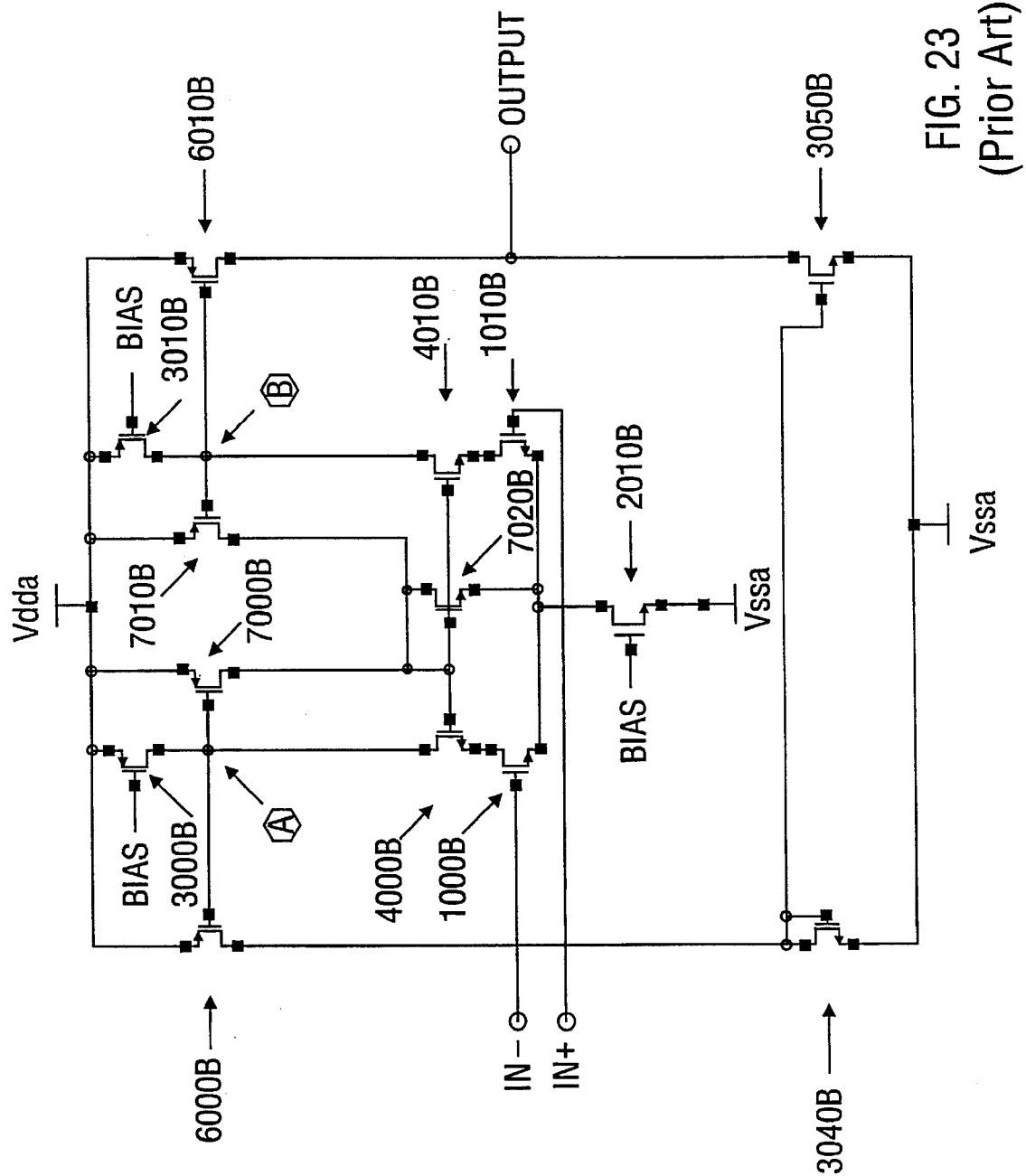
FIG. 23 is a schematic diagram of an amplifier with a feedback loop as contemplated in U.S. Pat. No. 5,239,210.

The accuracy of the amplifier circuit shown in FIG. 20 is particularly useful in volume control applications for audio systems. FIG. 21 illustrates stereo volume control circuit 405 that may utilize the present invention. Volume control circuit 405 has left and right analog signal input pins 409 and 408, left and right analog signal output pins 411 and 412, and analog ground pins 415 and 410. The right channel utilizes amplifier 420 and the left channel utilizes amplifier 421. As with amplifier 400, various types of amplifiers may be used for amplifiers 420 and 421, including for example, differential amplifiers as described above in relation to FIGS. 24–26. The amplifier noninverting input signals are attenuated with voltage dividers 416 and 417. The amplifier feedback is controlled with voltage dividers 422 and 423. Each voltage divider 416, 417, 422, and 423 is a logarithmic voltage divider providing up to 96 db attenuation through six 16 db resistors that utilize inaccessible compensation taps according to the principles described above and connected as shown in FIG. 15. The specific accessible output taps of voltage dividers 416, 417, 422 and 423 are decoded with multiplexers 418, 419, 424 and 425 respectively. Multiplexers 418, 419, 424 and 425 can be designed in a number of ways that are well known in the art.

Volume control circuit 405 may have additional power supply connections such as positive analog power pin 430, negative analog power pin 432, positive digital power pin 434 and digital ground pin 436. Digital input data that sets the analog output levels is provided to the circuit through serial data input pin 438. Serial clock pin 440 clocks in the individual bits of data from serial data input pin 438. The serial data may also be output through serial data output pin 442. The serial input data is converted to parallel data by serial to parallel register 444.

The input data is then provided through bus 446 to control register 426. Data is latched into control register according to a chip select signal at chip select pin 450. Control register 426 calculates desired amplifier noninverting signal input and inverting feedback input levels from the input data. For example, if it is desired to attenuate an analog input signal, the amplifier gain may be set to one and the signal may be attenuated with dividers 416 or 417. Alternatively if a gain is desired from the analog input to the analog output, zero attenuation may be chosen at dividers 416 and 417 while the desired feedback is selected through dividers 422 and 423. Further, a user could use many other combinations of input attenuation and feedback to achieve a desired output.

Control register 426 decodes the parallel input data into desired multiplexer control signals via a NOR gate array. However, other methods, such as look up tables may be used. Having calculated the desired amplifier levels, control register 426 delivers multiplexer control signals via buses 448 to multiplexers 418, 419, 424, and 425. The multiplexer control signals enable multiplexers 418, 419, 424 and 425 to decode the specific accessible output taps of voltage dividers 416, 417, 422 and 423 that correspond to the desired amplifier levels calculated by control register 426.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. A differential amplifier, comprising:

first and second differential transistors for receiving a differential voltage on respective gate terminals, and each having source/drain paths connected on a first end thereof to a first common node;

a first current source for supplying a first current to a second end of said first differential transistor;

a second current source for supplying a second current to a second end of said second differential transistor;

a common constant current source for sinking current from said first common node to a reference node;

a common variable current source for sinking a variable current from said first common node to said reference node; and control circuitry coupled to said first and second differential transistors to sense the current through said first and second differential transistors, said control circuitry controlling said common variable current source to maintain the currents through said first and second differential transistors substantially constant.

2. The amplifier of claim 1 wherein said common variable current source and said control circuitry comprise:

first and second feedback transistors each having source/drain paths connected on a first end thereof to a second common node, a second end of the source/drain path of said first feedback transistor being connected to a node intermediate said first current source and said second end of said first differential transistor, and a second end of the source/drain path of said second feedback transistor being connected to a node intermediate said second current source and said second end of said second differential transistor; and a third feedback transistor having a gate of said third feedback transistor connected to said second common node, having a source/drain path connected between said first common node and said reference node.

3. The amplifier of claim 2, said common variable current source and said control circuitry further comprising:

a fourth feedback transistor having a source/drain path connected between said second common node and said reference node; and a capacitor connected between said second common node and said reference node.

4. The amplifier of claim 1, further comprising:

a first cascode transistor having a source/drain path thereof disposed in series between said first current source and said first differential transistor; and a second cascode transistor having a source/drain path thereof disposed in series between said second current source and said second differential transistor, wherein the gates of said first and second cascode transistors are biased together.

5. The amplifier of claim 4, said control circuitry comprising:

first and second feedback transistors;

a third cascode transistor having a source/drain path thereof coupled in series with said first feedback transistor; and a fourth cascode transistor having a source/drain path thereof coupled in series with said second feedback transistor.

6. The amplifier of claim 3, further comprising:

a first series transistor and a first mirror series transistor having source/drain paths disposed in series between said first current source and said reference node; and a second series transistor and a second mirror series transistor having source/drain paths disposed in series between said first current source and said reference node, wherein said first and second series mirror transistors form a current mirror such that a current through an output of said amplifier is the difference between the current flowing in said second series transistor and the current flowing in said first series transistor.

7. The amplifier of claim 6, further comprising:

a plurality of cascode transistors, at least one cascode transistor coupled to each of said first and second differential transistors and at least one cascode transistor coupled to each of said first and second feedback transistors.

8. A differential amplifier, comprising:

a differential signal circuit path having an output at an output node reflecting a differential voltage on respective gate terminals of first and second differential transistors;

a third transistor having a source/drain path coupled in series between a first voltage supply and said first differential transistor;

a fourth transistor having a source/drain path coupled in series between said first voltage supply and said second differential transistor; and common mode feedback circuitry connected to a first end of said source/drain path of said third transistor and connected to a first end of said source/drain path of said fourth transistor, said common mode feedback circuitry having a feedback output mode controlling a variable current source, said variable current source coupled to said first and second differential transistors, to maintain the currents through said first and second differential transistors substantially constant, wherein said common node feedback circuitry having one low frequency pole at said feedback output node, said feedback output node being outside of said differential signal circuit path, and said differential signal circuit path having one low frequency pole at said output node, thereby allowing independence of frequency response of the common node feedback circuitry and the differential signal circuit path.

9. A differential amplifier, comprising:

a differential signal circuit path having an output at an output node reflecting a differential voltage on respective gate terminals of first and second differential transistors;

a third transistor having a source/drain path coupled in series between a first voltage supply and said first differential transistor;

a fourth transistor having a source/drain path coupled in series between said first voltage supply and said second differential transistor; and common mode feedback circuitry connected to a first end of said source/drain path of said third transistor and connected to a first end of said source/drain path of said fourth transistor, said common mode feedback circuitry controlling a variable current source, said variable current source coupled to said first and second differential transistors, to maintain the currents through said first and second differential transistors substantially constant, wherein said common mode feedback circuitry having one low frequency pole at a first node, said first node outside of said differential signal circuit path, and said differential signal circuit path having one low frequency pole at said output node; and a fifth transistor providing a current sink between a common node and a second voltage supply, said common node shared by said first and second differential transistors, wherein said common mode feedback circuitry comprises a first feedback transistor having a source/drain path coupled in series between said third transistor and said first node;

a second feedback transistor having a source/drain path coupled in series between said fourth transistor and said first node; and a third feedback transistor, acting as the variable current source, having a gate connected to said first node, and having a source/drain path coupled in series between said common node and said second voltage supply.

10. The amplifier of claim 9 wherein an increase of the sum of the currents flowing through said first and second feedback transistors causes an increase in the current flowing through said third feedback transistor and an increase in the current flowing in said third feedback transistor causes a decrease in the currents flowing in each of said first and second feedback transistors.

11. The amplifier of claim 8, further comprising:

fifth and sixth transistors, the source/drain paths of said fifth and sixth transistors coupled in series between said first voltage supply and a second voltage supply, said second voltage supply coupled to said variable current source;

seventh and eighth transistors, the source/drain paths of said seventh and eighth transistors coupled in series between said first voltage supply and said second voltage supply; and an output node located between the series connection of said seventh and eighth transistors.

12. The amplifier of claim 11, further comprising:

a plurality of cascode transistors, at least one cascode transistor coupled to each of said differential transistors.

13. A method of compensating for a common mode signal in a differential amplifier, comprising the steps of:

providing first and second differential transistors each having a source/drain which are each connected on a first end to a common node, the gates of the first and second differential transistors comprising differential inputs;

generating a first contstant current source for input to the second end of the source/drain path of the first differential transistor and supplying a first substantially constant current;

generating a second constant current source for input to the second end of the source/drain path of the second differential transistor and supplying a second substantially constant current;

generating a common current source for sinking a current from the common node to a reference;

generating a variable current source for sinking a variable source of current from the common node to the reference; and varying the current through the variable current source in response to currents sensed through said first and second differential transistors to maintain the current through the first and second differential transistors independent of current variations through the common current source.

14. The method of claim 13, further comprising:

generating at least one common mode signal low frequency pole outside of a differential signal path, said differential signal path being the signal path between said first and second differential transistors and an output of said amplifier; and generating at least one differential signal low frequency pole outside a common mode feedback signal path, said common mode feedback signal path controlling said variable current source.

15. The method of claim 13, further comprising:

placing said common current source and said variable current source in parallel between said common node and said reference.

\* \* \* \* \*

UNITED STATES PATENT AND TRADEMARK OFFICE
CERTIFICATE OF CORRECTION

PATENT NO. : 5,475,323
DATED : December 12, 1995
INVENTOR(S) : Larry L. Harris and Baker P.L. Scott, III It is certified that error appears in the above-identified patent and that said Letters Patent is hereby corrected as shown below:

In claim 8, column 22, line 2, delete "mode" and insert --node-- therefor.

In claim 8, column 22, line 7. delete "node" and insert --mode-- therefor.

Signed and Sealed this

Nineteenth Day of March, 1996

Attest:

BRUCE LEHMAN

Attesting Officer     Commissioner of Patents and Trademarks